(12) United States Patent
Kaminishi

(10) Patent No.: US 6,618,406 B1
(45) Date of Patent: Sep. 9, 2003

(54) OPTICAL SEMICONDUCTOR DIODE DRIVER CIRCUIT AND OPTICAL TRANCEIVER MODULE

(75) Inventor: Katsuji Kaminishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/340,378

(22) Filed: Jun. 28, 1999

(30) Foreign Application Priority Data

Jun. 29, 1998  (JP) .......................................... 10-183084

(51) Int. Cl.$^7$ ............................................... H01S 5/042
(52) U.S. Cl. ........................................................ 372/38
(58) Field of Search ............................................ 372/38

(56) References Cited

U.S. PATENT DOCUMENTS

| | | | | |
|---|---|---|---|---|
| 4,709,370 A | * | 11/1987 | Bednarz et al. | 372/38.02 |
| 5,327,451 A | * | 7/1994 | Walker et al. | 372/98 |
| 5,736,844 A | * | 4/1998 | Yanagisawa | 323/282 |
| 5,848,044 A | * | 12/1998 | Taguchi et al. | 369/53.26 |
| 5,883,910 A | * | 3/1999 | Link | 372/38.07 |
| 6,021,144 A | * | 2/2000 | Meyer et al. | 372/38.02 |
| 6,037,832 A | * | 3/2000 | Kaminishi | 372/538 |
| 6,072,816 A | * | 6/2000 | Shin'e | 372/38.02 |
| 6,111,901 A | * | 8/2000 | Taguchi et al. | 372/38.02 |
| 6,292,497 B1 | * | 9/2001 | Nakano | 372/29.015 |

FOREIGN PATENT DOCUMENTS

JP         11103108         4/1999

OTHER PUBLICATIONS

U.S. patent application Ser. No. 09/126,779, US 6037832.

* cited by examiner

*Primary Examiner*—Paul Ip
*Assistant Examiner*—Jeffrey N Zahn
(74) *Attorney, Agent, or Firm*—Hogan & Hartson, LLP

(57) ABSTRACT

An optical semiconductor diode driver circuit, which is stably operable even with the supply of a source voltage slightly higher than the forward operation voltage of an optical semiconductor diode to be driven and can output switch current and voltage sufficient for driving the optical semiconductor diode, includes a pre-driver circuit operating as a limiting amplifier, and an output circuit responsive to a pulse-shaped voltage output from the pre-driver circuit and outputting a drive pulse current to the optical semiconductor diode as an external load. The output circuit is basically a type of the emitter-coupled amplifier which has either a differential configuration or a similar one to a Schmitt circuit and whose common-emitter loads are composed of a resistor and a variable constant current source to determine a amplitude of the output current pulse with small rise and fall times. Since a variable constant current source is added, the circuit alleviates influences from variations of the impedance of the load and the operating environment without any degradation of high frequency characteristics.

7 Claims, 26 Drawing Sheets

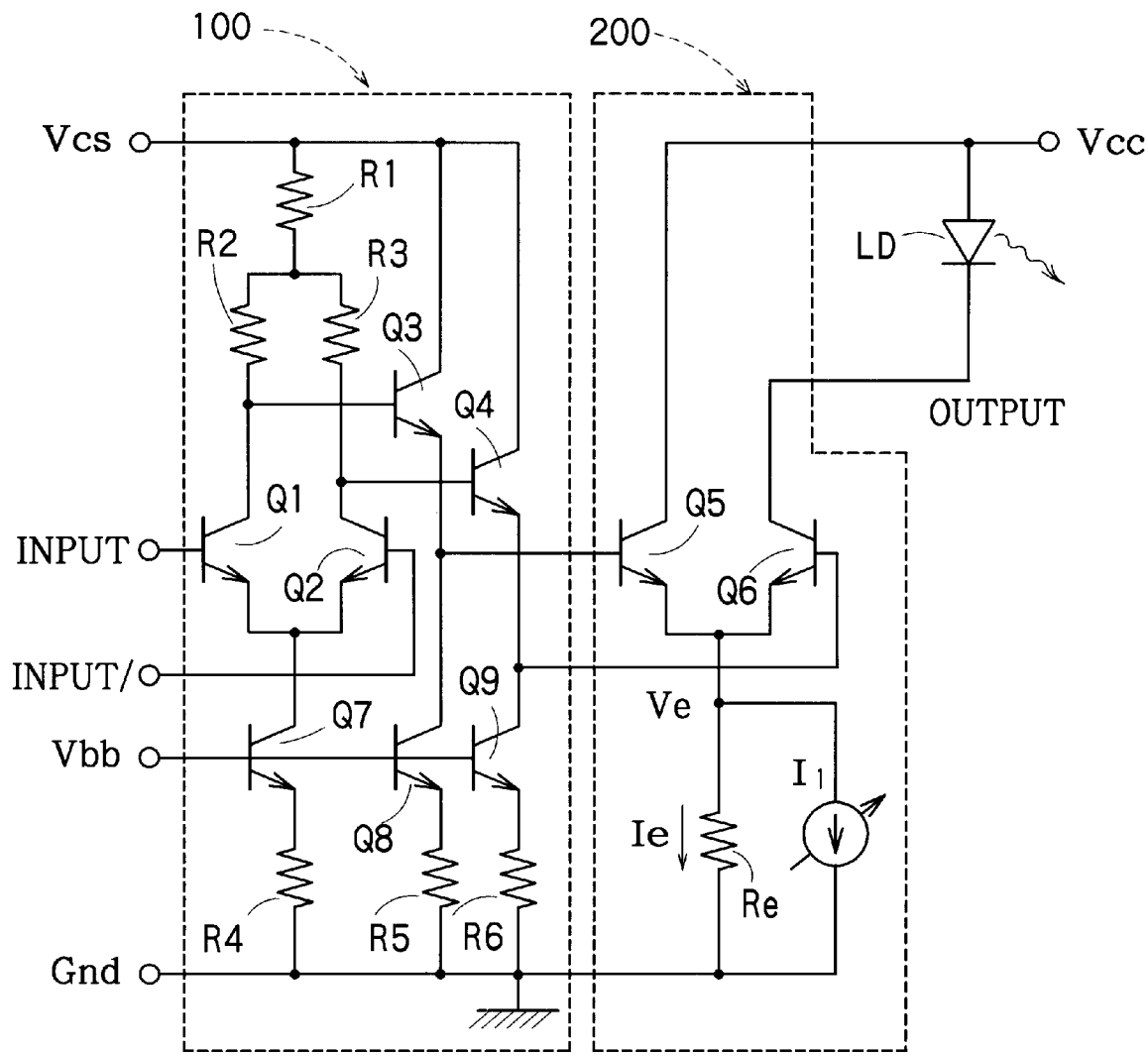
F I G. 1

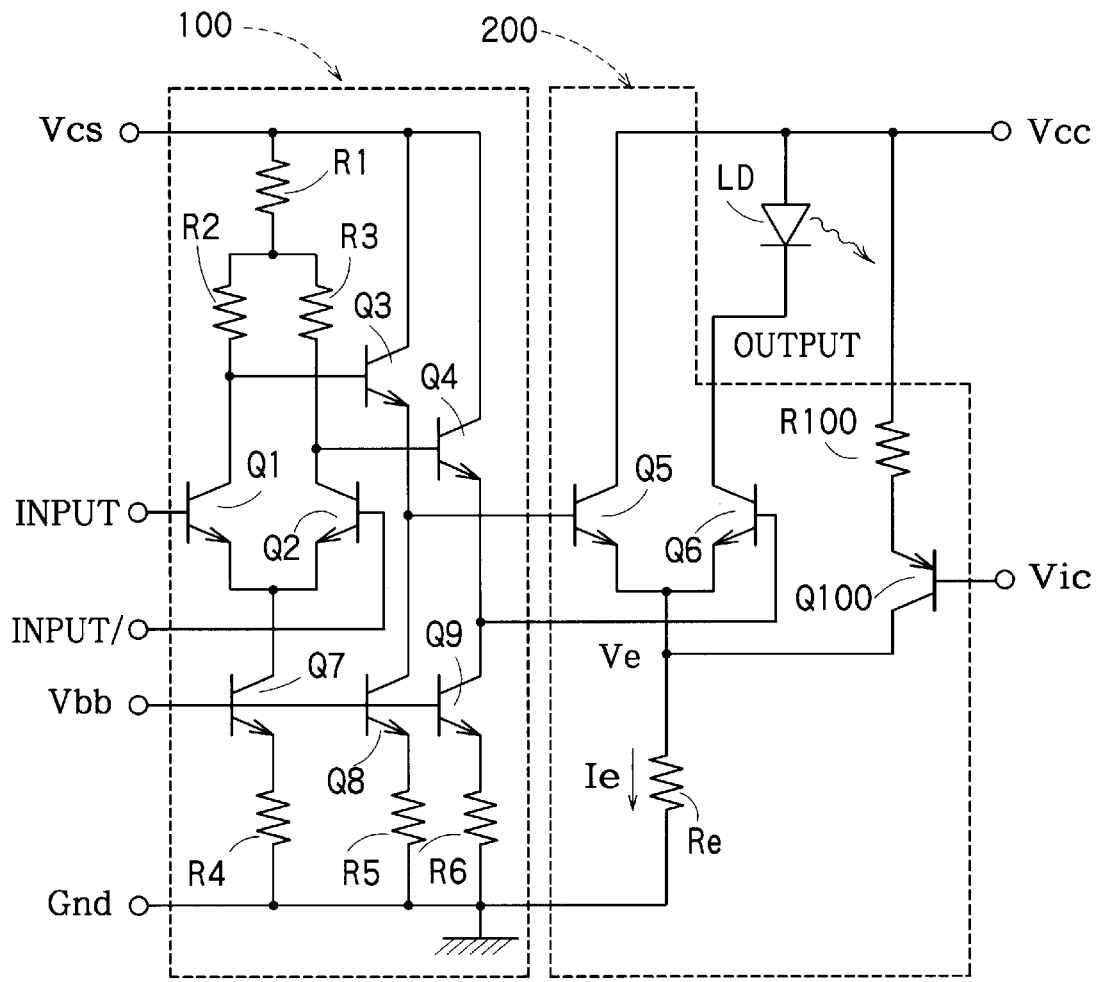
F I G. 3

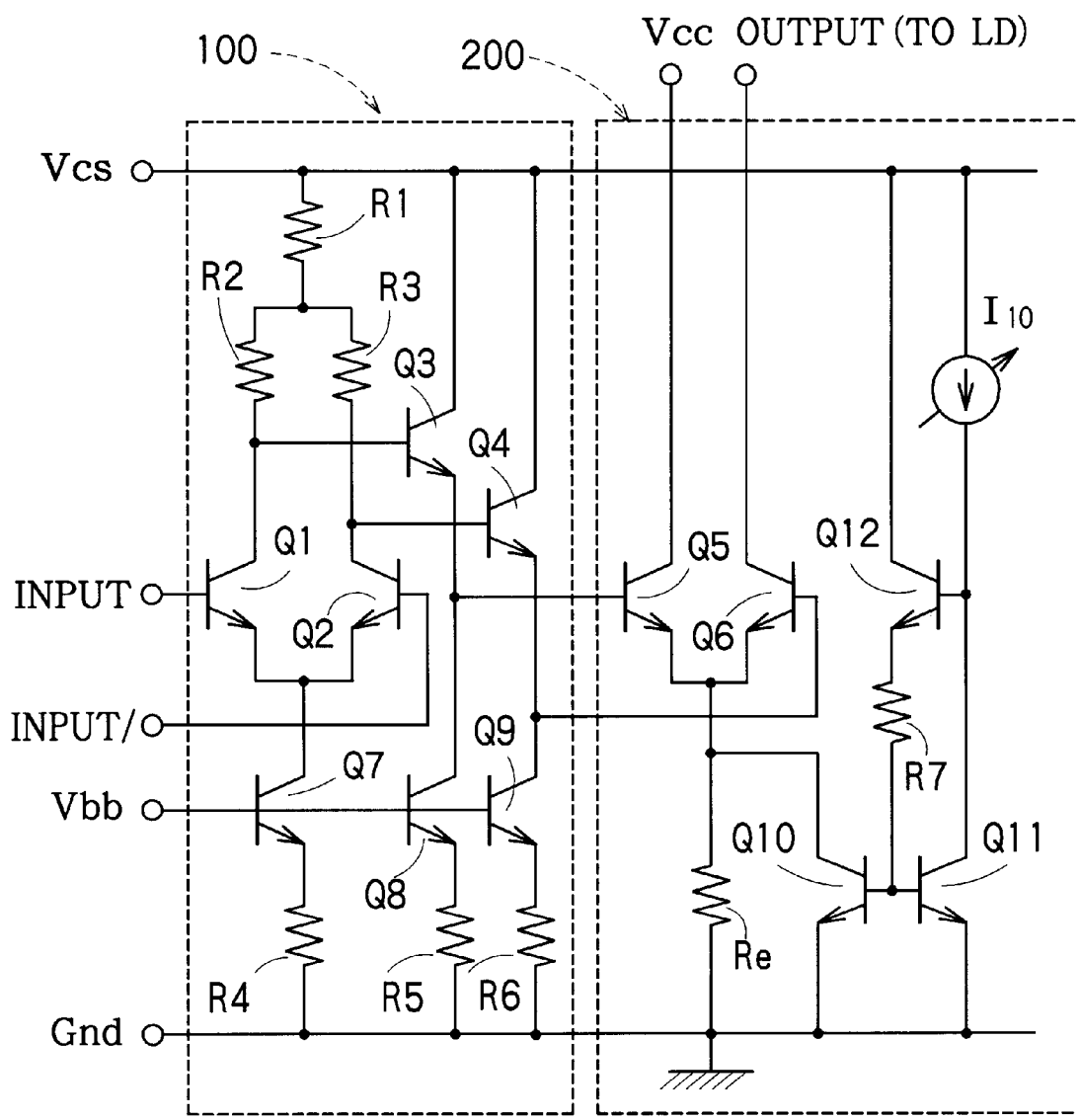
F I G. 4

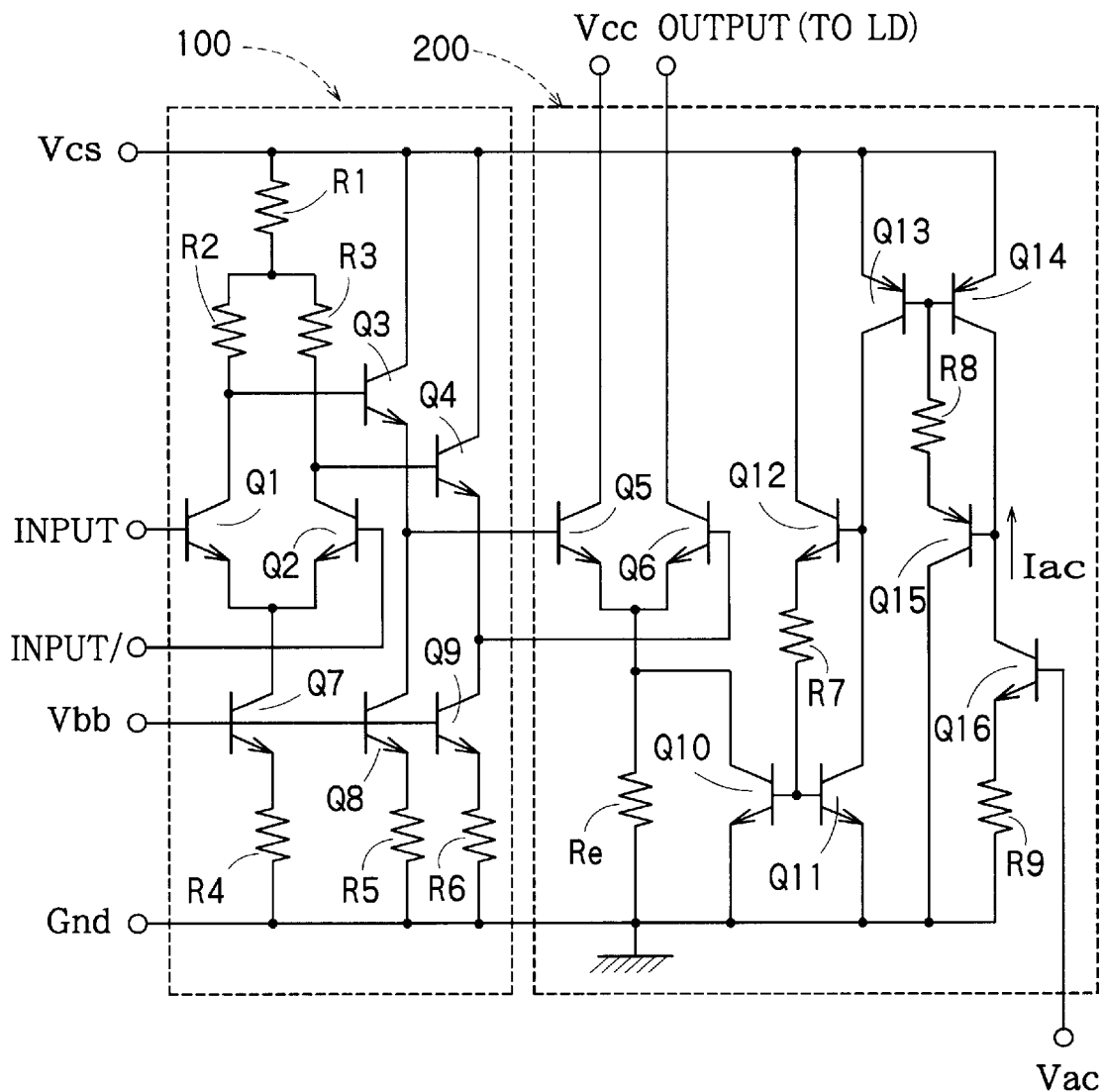
F I G. 5

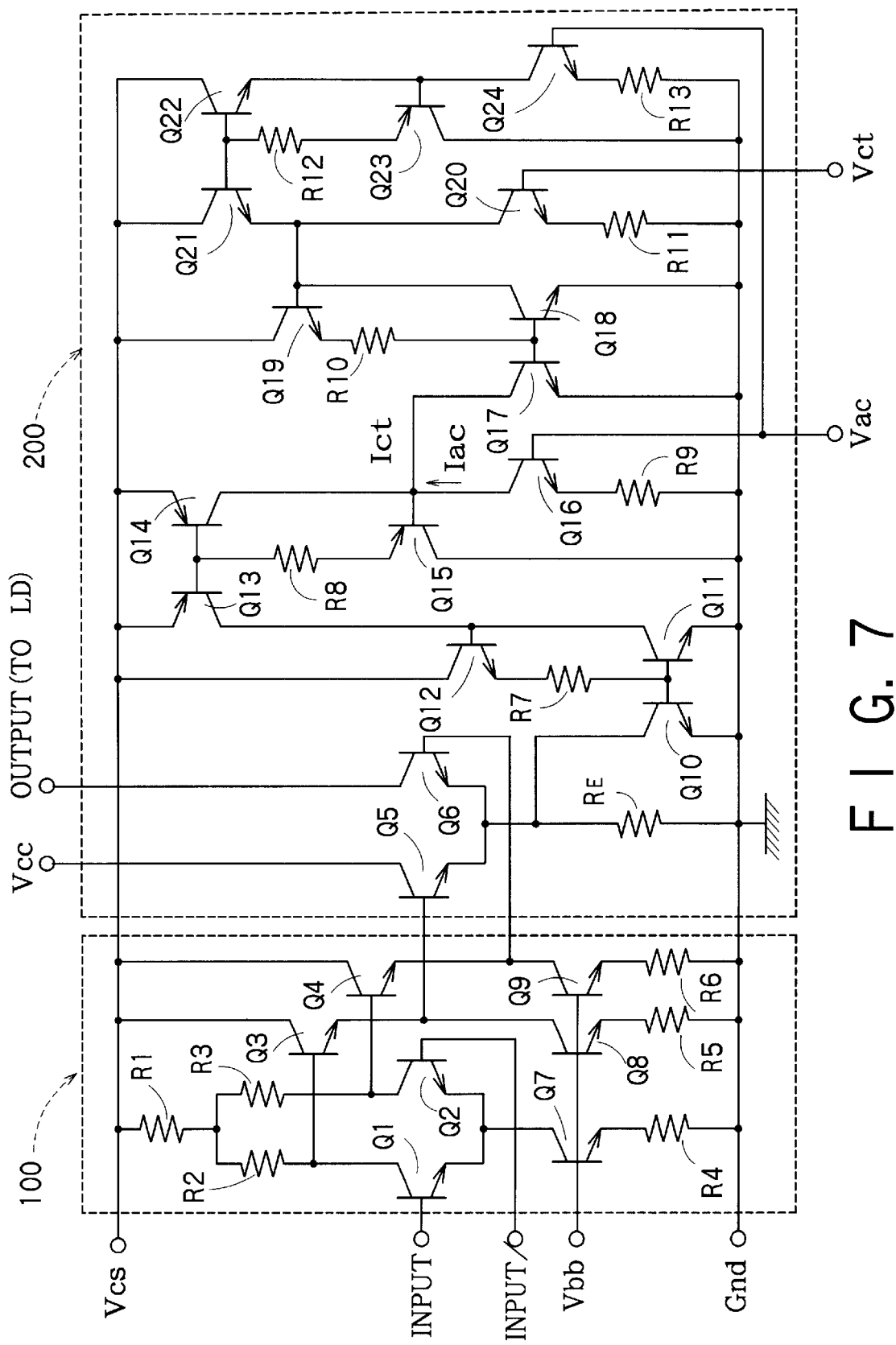
F I G. 7

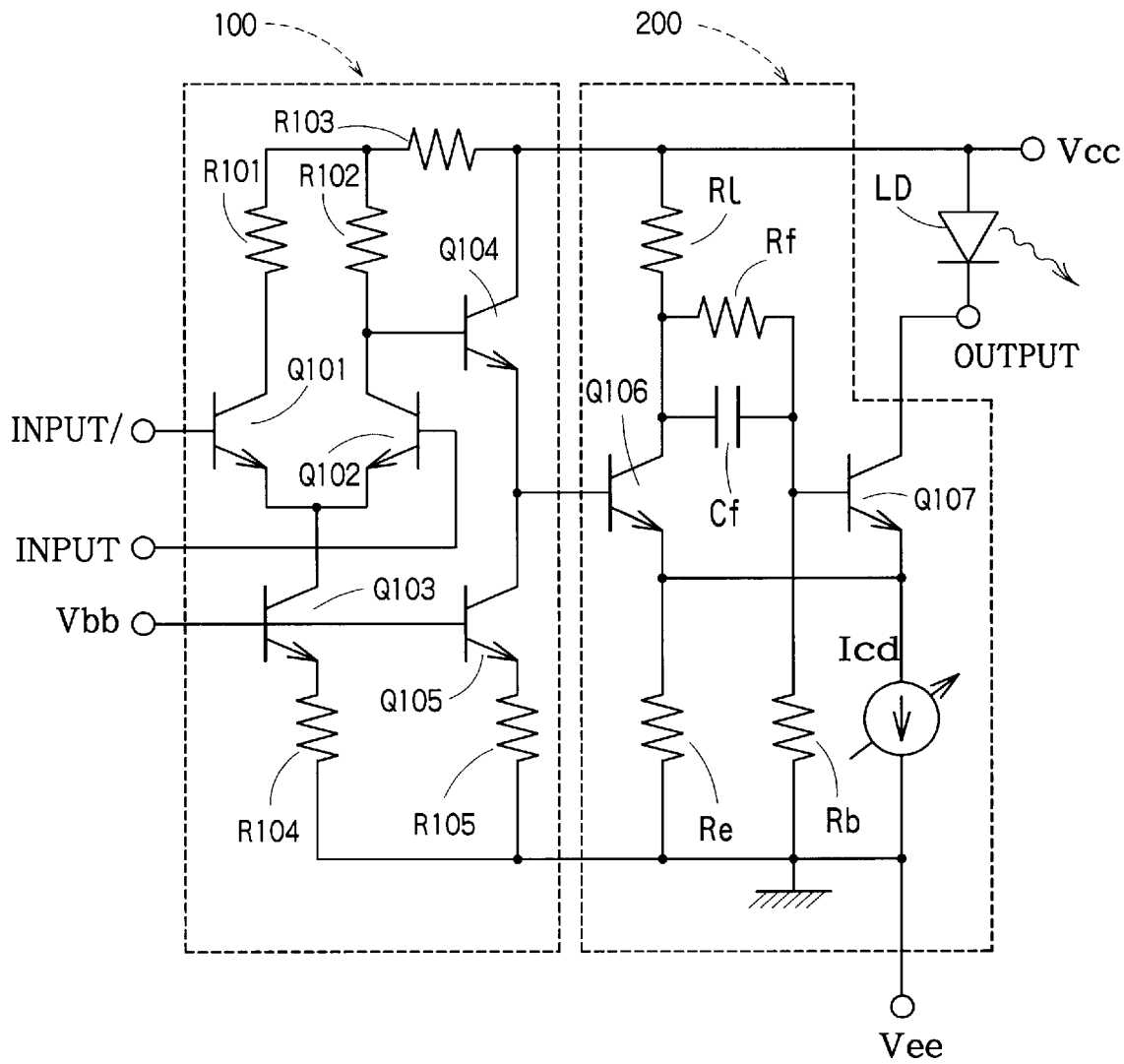
F I G. 9

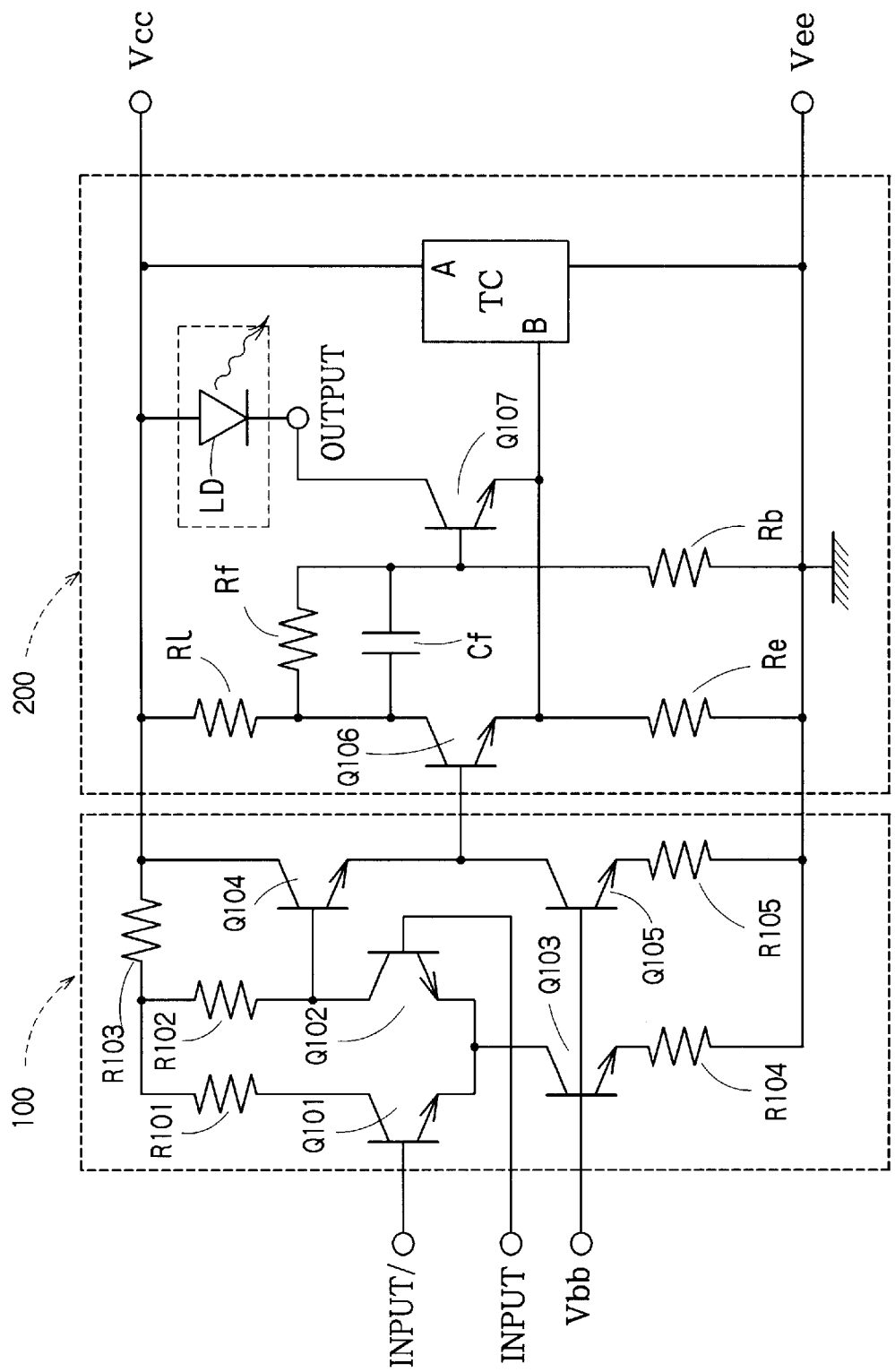
F I G. 12

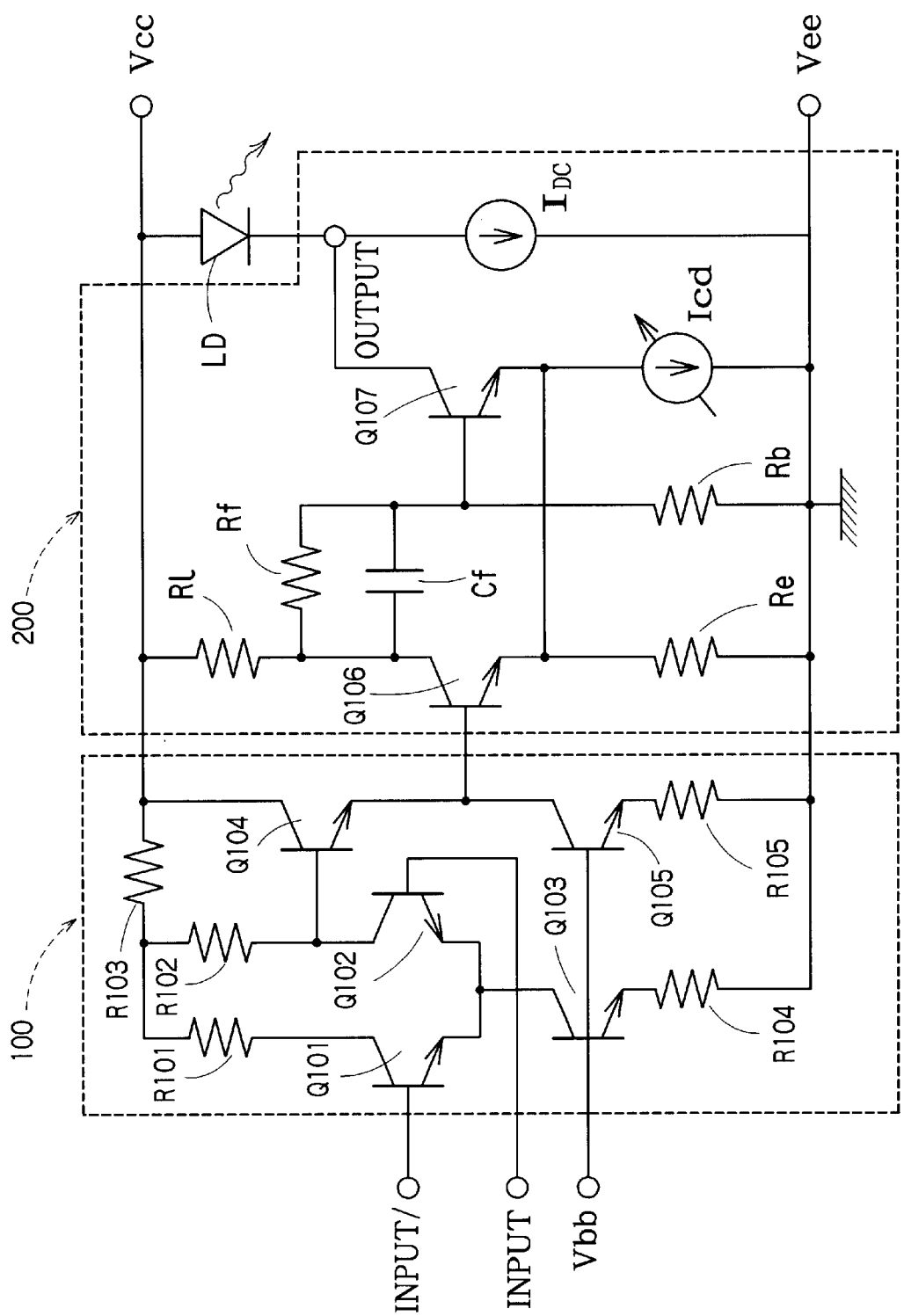
F I G. 14

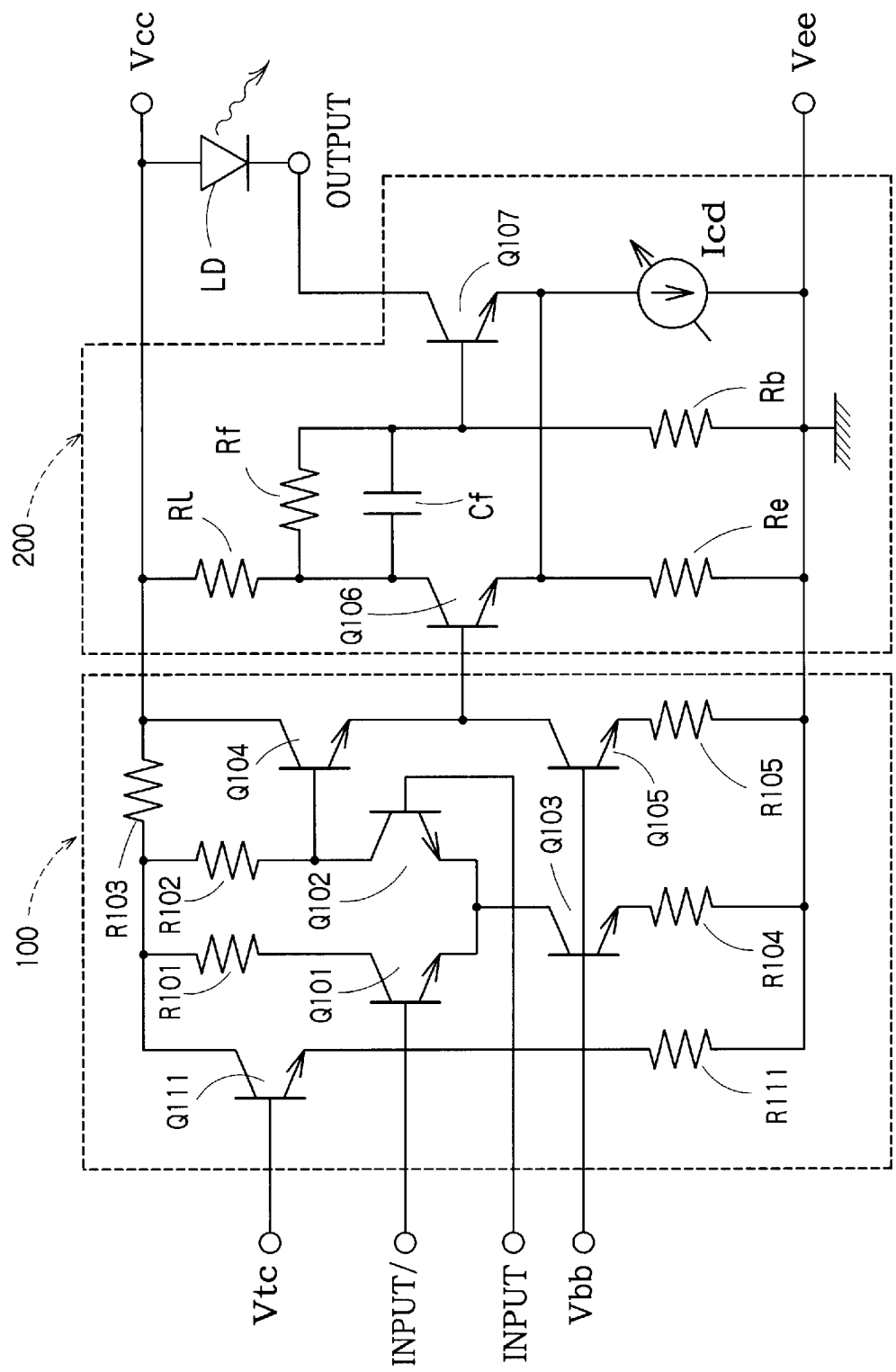
F I G. 16

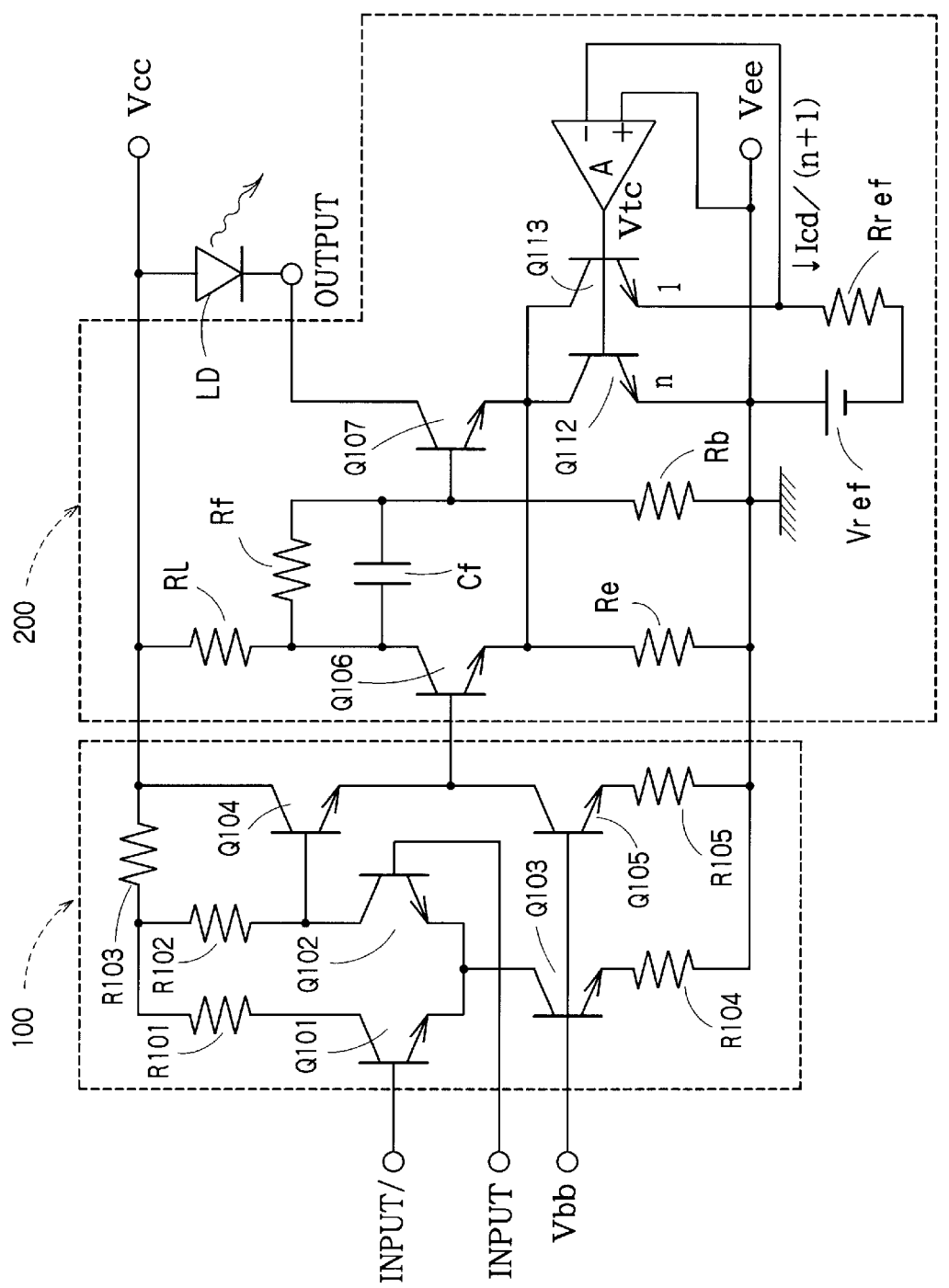
F I G. 17

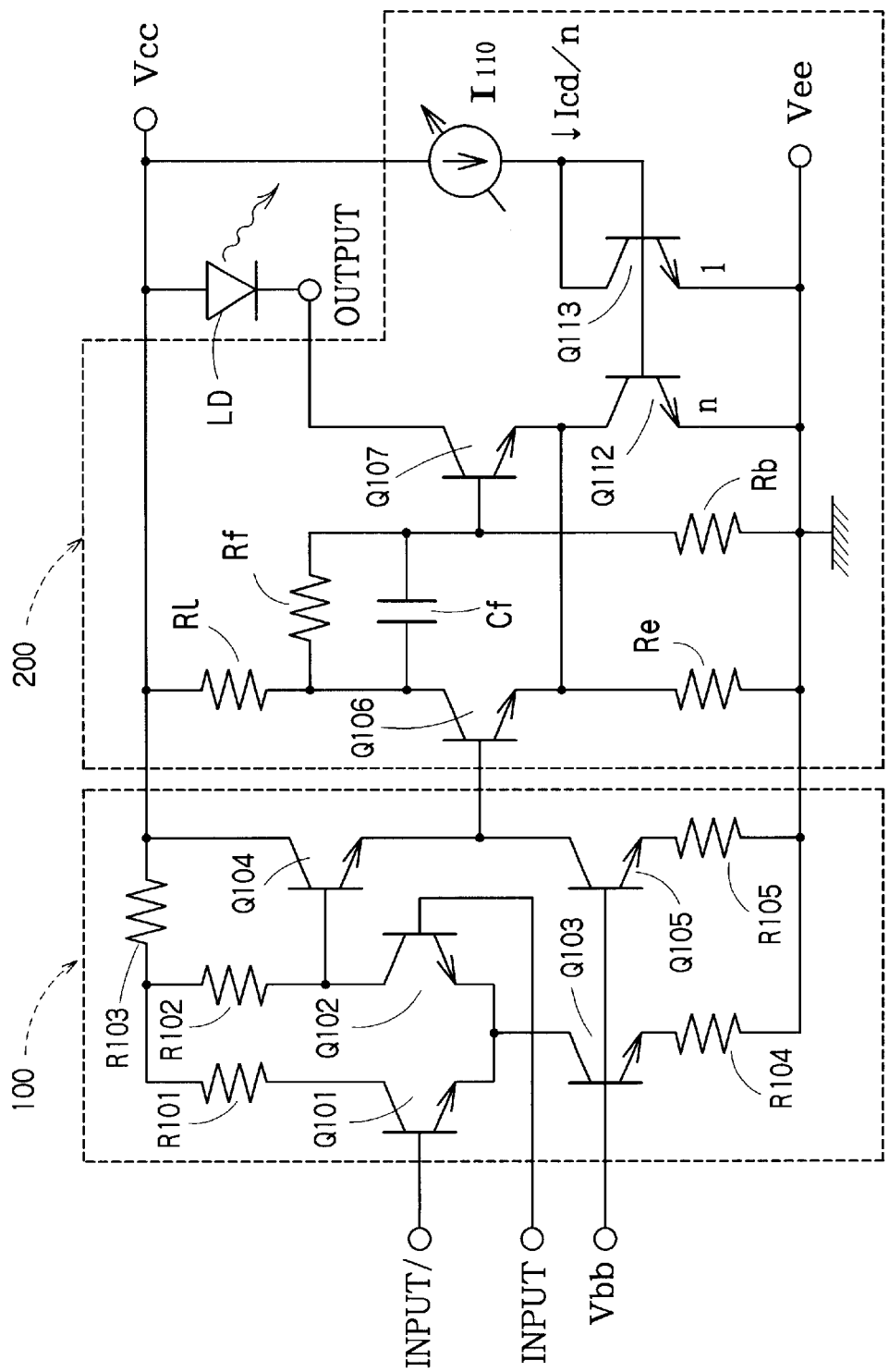
F I G. 18

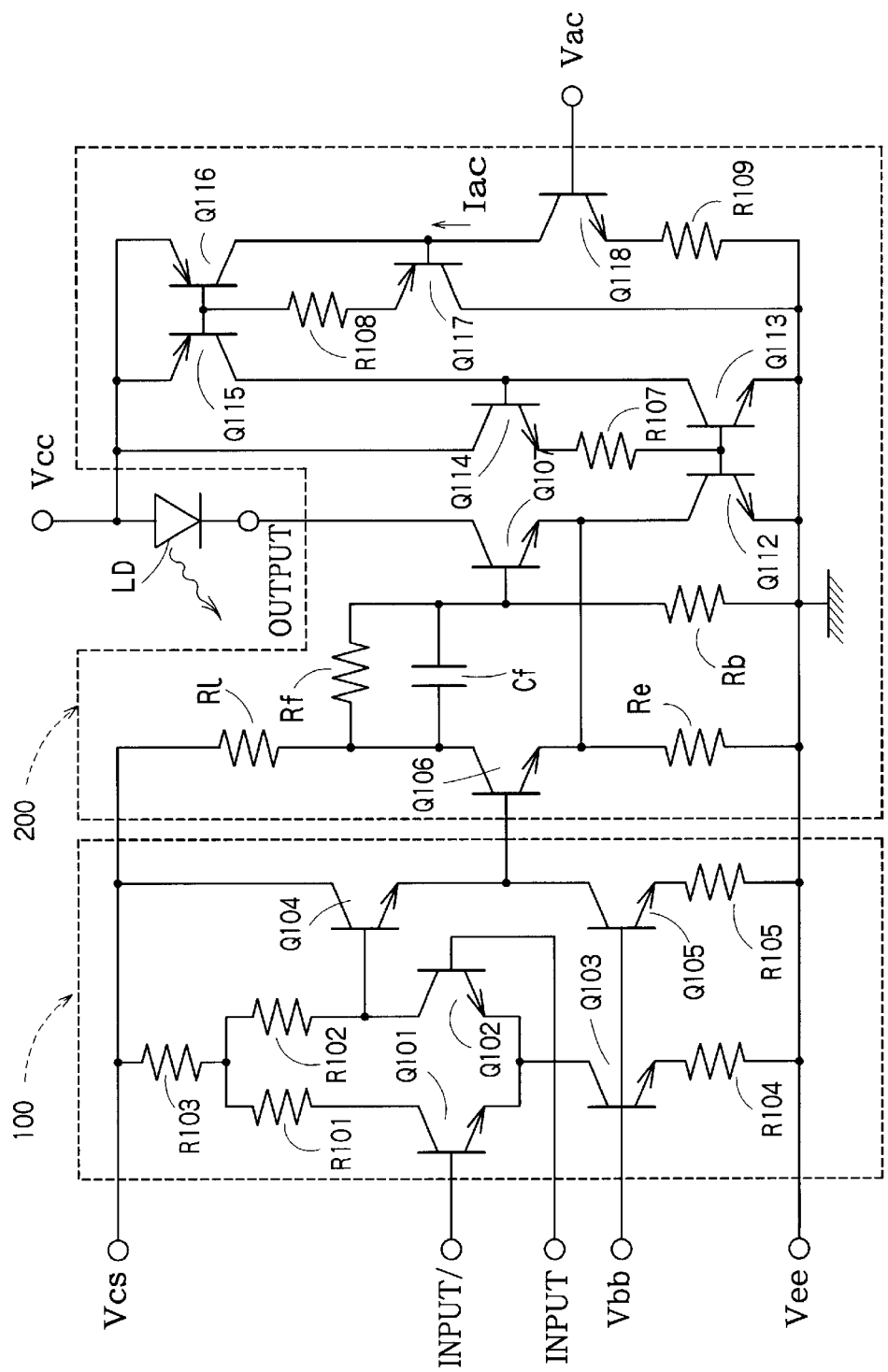
F I G. 20

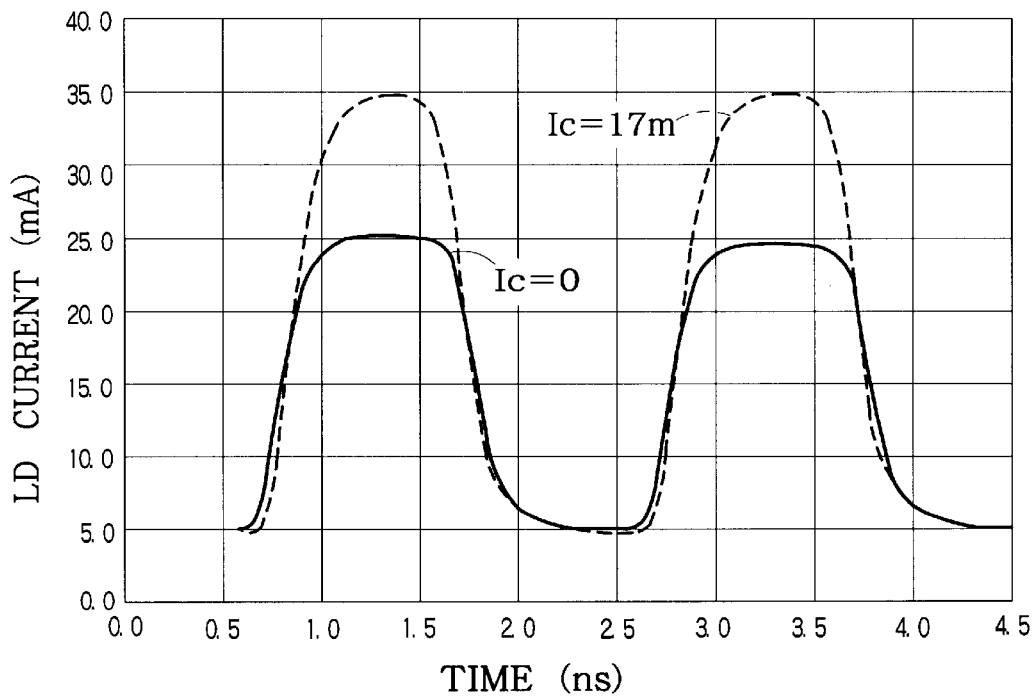
F I G. 22
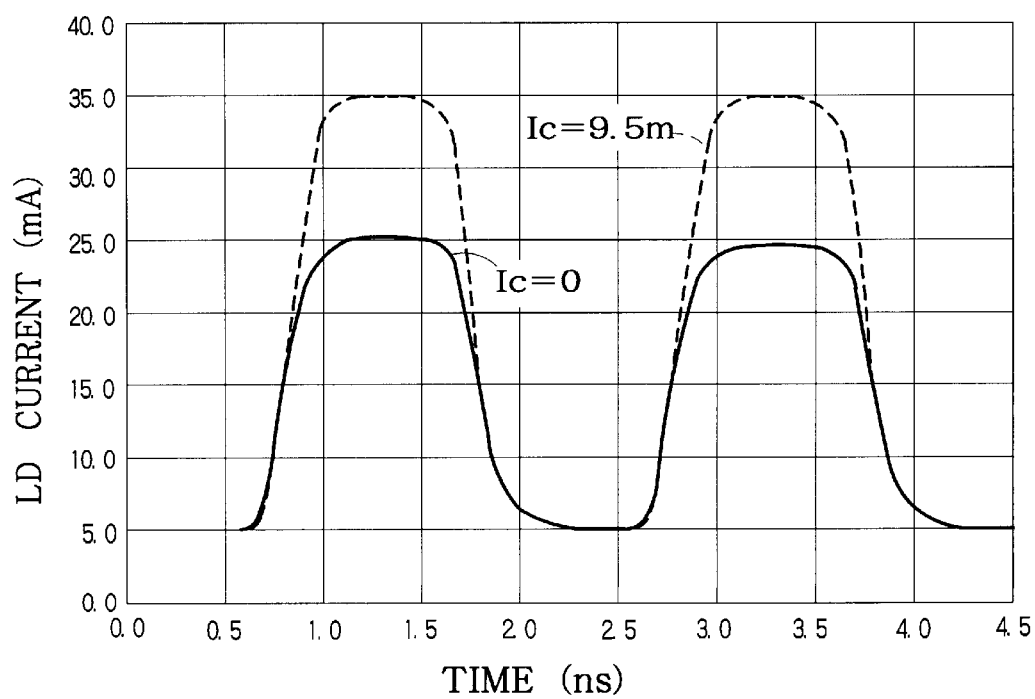
F I G. 23

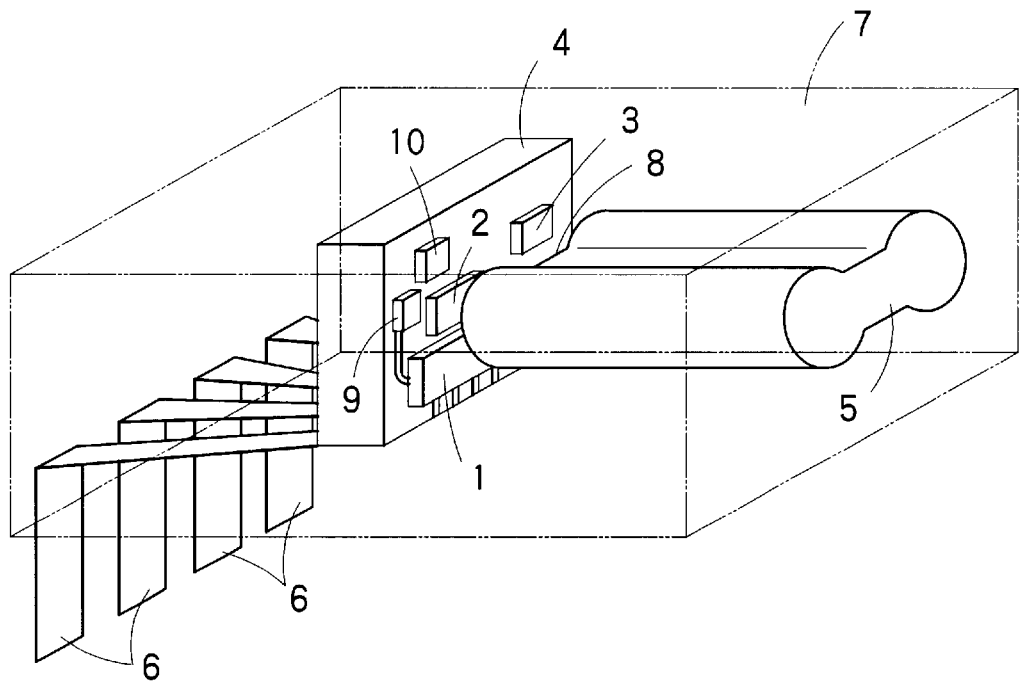
F I G. 26
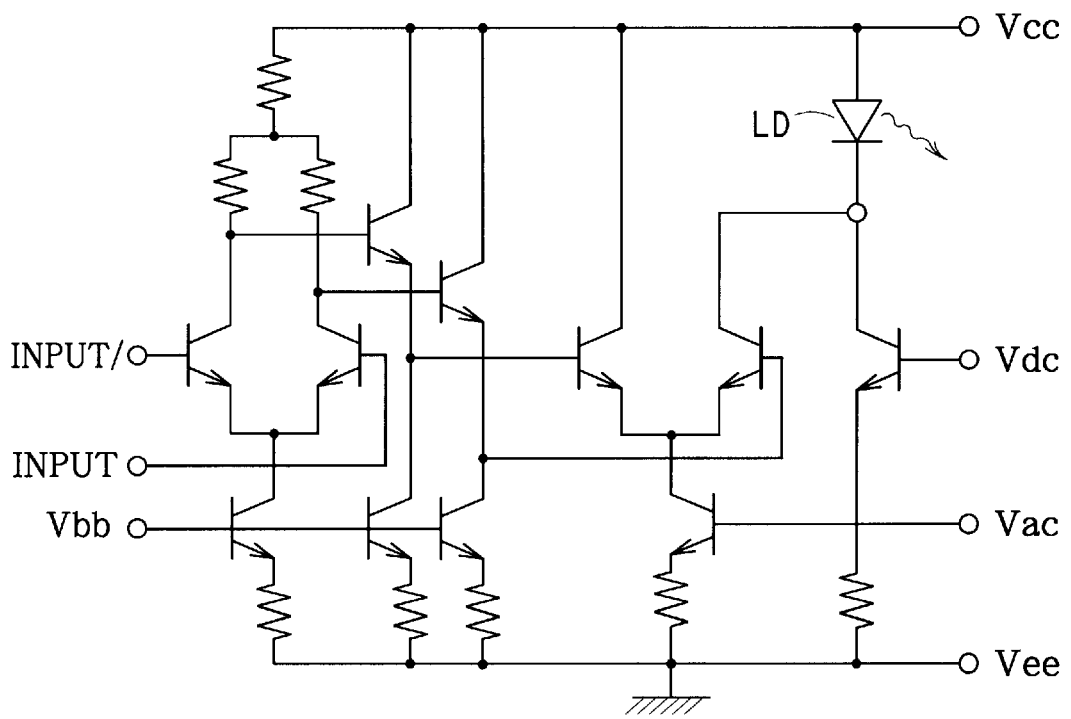
F I G. 27

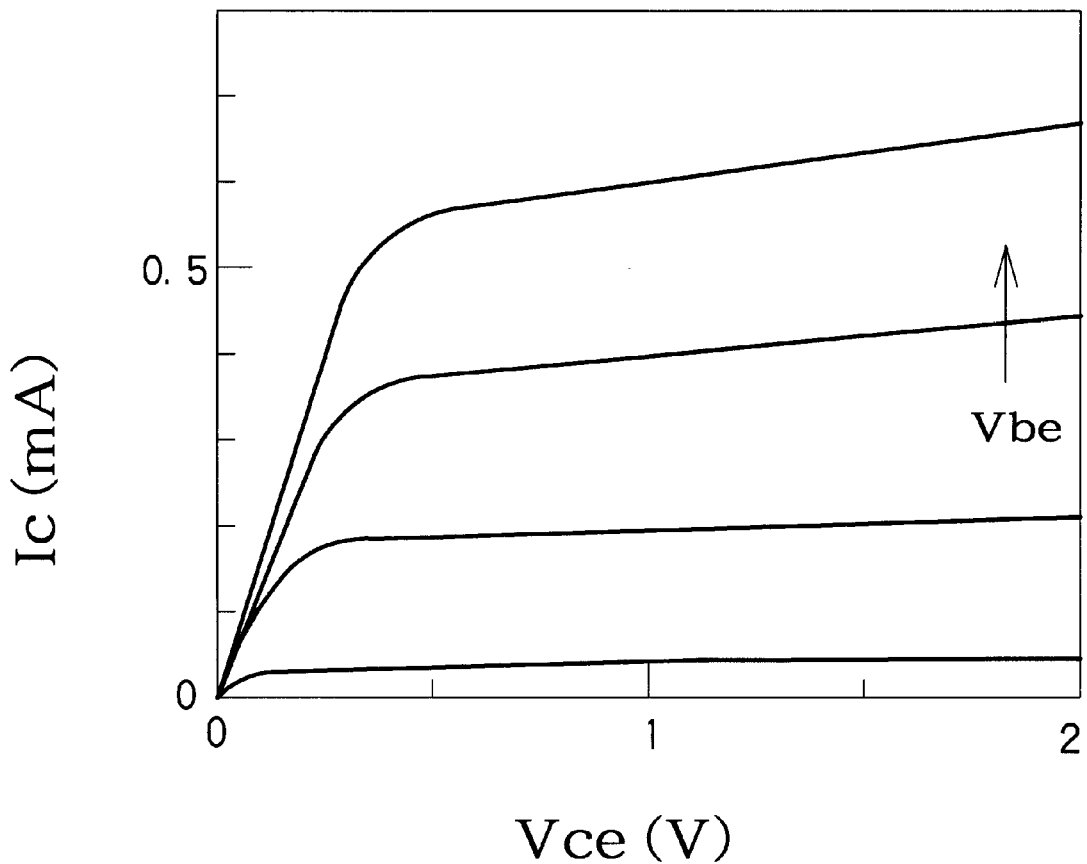
F I G. 28

OPTICAL SEMICONDUCTOR DIODE DRIVER CIRCUIT AND OPTICAL TRANCEIVER MODULE

BACKGROUND OF THE INVENTION

This invention relates to an optical semiconductor diode driver circuit and optical transceiver modules. In more detail, the invention relates to an optical transmission device used for optical communications or optical data links, and more particularly, to an optical semiconductor diode driver circuit and optical transceiver modules fully operative with a low voltage power supply, under a severe condition that the difference between a forward bias voltage of the diode and a power supply voltage for the driver circuit, required for driving the optical semiconductor diode, is fairly small.

The currently rapid growth multimedia is supported by various network backbones from WAN (wide area network) to LAN (local area network). Among them, optical communication and FDDI (fiber distributed data interface) are typically used, for which high-speed and high-performance optical transmission devices are indispensable. Recently, in particular, not only for high-speed telecommunication but also for the application to data communication between computers, the need for reliable and high-throughput optical interconnection technologies is progressively increasing.

To cope with the requirement, fiber channels and IEEE 1394 have been standardized and several data links with use of optical fibers are going to be developed. As downsizing of computers is also progressing rapidly, PC (personal computers) and/or EWS (engineering workstation) become a standard data processing tool. So, regarding specifications required for interconnection, much importance has been attached to applicability from a practical viewpoint in addition to a high performance in throughput. That is, from the viewpoint of practical application to a system, there is a demand for devices operative with a low power consumption for abbreviation of a cooling system, with the same electrical input/output interface as that of ICs used in a computer system, and preferably with the same power supply voltage. From the viewpoint of the cost effectiveness of the system, there is a strong demand for realization of low-cost optical transceiver modules.

Especially in the IEEE 1394 standard just fixed, for purposes of reducing the link cost by optical fibers and optical transceiver modules, it is presumed that the combination of plastic fibers and a light source of the red wavelength band matched to a low transmission loss through fibers will be rapidly grown. A semiconductor laser diode (LD) oscillating with a wavelength of about 650 nm is used as a light source of the red wavelength band.

However, through investigations by the Inventor, employment of such a red LD has revealed to cause a new problem different from those of optical transmitters in conventional optical telecommunication using infrared LDs with wavelength bands longer than 1.3 um. This problem is as follows.

In case of an optical communication device using the infrared LD, since the photon energy emitted from the LD is 1 eV or less, the applying voltage to the LD under operation is from 1.2 V to 1.5 V at most. However, since the photon energy is inversely proportional to the wavelength and the band gap energy of the semiconductor is proportional to the photon energy, the forward bias voltage of the diode required for operation of the optical semiconductor diode with a red region becomes high compared with the infrared LD. For example, in case of LD oscillating at a wavelength of 650 nm or less, the forward voltage necessary for the LD drive is at least 2 V. Considering it into account of the voltage drop due to an internal resistance increase and/or the need for a large driving current, it must be expected that the forward voltage increases to about 2.5 V maximum.

On the other hand, a usual power supply voltage for operating recent signal processor ICs or memory ICs is being reduced from 5 V to 3.3 V, and also the voltage of 3.3 V or less is expected to be the standard in a near future. Additionally, the finer micro-processes for decreasing the power consumption of signal processor ICs and for getting their processing speed have been developed one after another, and the shift of decreasing the internal operation voltage inside ICs to the order of 2 V or less is also rapid. However, in order to avoid complexities and cost-increasing disadvantages on building the system with mixing interfaces of different voltage levels, it is a general trend that input/output interfaces of ICs are brought into matching with the common logic level of the 3.3 V system, even when the IC internal operation voltage is lower than 3.3 V.

Therefore, it is important to realize a LD driver circuit that can be designed to guarantee a fully functional operation on a single 3.3 V power supply. In other words, it is indispensable to realize a diver IC capable of driving the LD with the forward bias voltage of 2.5 V, maximum, on a power source of 3.3 V. Even if we consider just 5% fluctuation in power supply voltage that is the minimum requirement for any system, the difference between the source voltage and the forward operation voltage of LD is 0.635 V only. If we suppose that a maximum power supply change of 10% is allowed as in popular cases and a voltage drop by wiring resistance inside an IC package is assumed to be small of 47 mV, the voltage difference may decrease by 0.4 V.

FIG. 27 shows a schematic circuit diagram of a conventional LD driver circuit. Since the conventional driver circuits have been usually designed to operate with a source voltage of 5 V or a higher voltage, a sufficient output voltage for a LD operation was ensured, which is much greater than the forward voltage of LD. Then it was easy to share a voltage necessary for a current switching transistor and a control transistor of a constant current source in the LD driver circuit respectively. Therefore, as shown in FIG. 27, the stacked configuration of the two sub-circuits, a differential transistor switch circuit and a high-accuracy constant current generating circuit, has been widely employed to ensure high-speed and relatively large switched current, and precise output amplitude in the driver IC.

Here the LD driver circuit shown in FIG. 27 is illustrated briefly but more concretely. This circuit includes a pre-driver circuit at its input portion and a large-current switch output circuit at its output stage. The pre-driver works as a pulse shaper, which is made up of a differential limiting amplifier and emitter followers. The output circuit is made up of differential transistors for switching on and off the current of the constant current source according to the high and low level of the logic input respectively. And also a constant current source is connected to the collector of the final output transistor for applying a DC bias current to the LD. In order to achieve a properly functional operation of the output stage on this circuit configuration, it is important to keep the total voltage margins of the collector-emitter bias sufficient for non-saturated operation of the output differential switching transistors, and necessary for operating the constant current source connected to their emitters.

FIG. 28 shows voltage-current characteristics of a typical high speed npn transistor. When the base-fixed constant current generating circuit in FIG. 27 is designed on trial considering such npn transistor characteristics as shown in FIG. 28, it has been confirmed that the total voltage necessary for the reference resistance bias and the collector-emitter voltage of the control transistor for the constant current source is more than 0.5 V, even if paying careful attention to minimizing the operation biases. However, to design a 3.3V driver IC with use of the above configuration, even when assuming the aforementioned voltage difference 0.635 V, if it is pile up thereon, the voltage that can be applied to the switch transistor is about 0.1 V only. Then it is impossible to achieve the normal operation of the switch transistors in the linear region.

This problem might be solved by supplement an insufficient voltage assisted by a DC-DC converter circuit inside IC for generating a higher voltage or a negative voltage from positive source input. In this case, however, since the current for driving an optical semiconductor diode is usually as relatively large as at least decades of mA, a larger current supply capacity is required in the increased or negative internal voltage generating circuit, which results in the need for an additional external capacity or the need for a massive inductor, and therefore makes it difficult to realize a LD drive circuit as a one-chip IC. Furthermore, there occurs another problem that power consumption of an IC as a whole increases because of a loss in the voltage converter circuit for generating the different voltage in addition to an essential increase in power consumption caused by the increase in effective source voltage to get a normal operation of the circuit.

As discussed above, if a red optical semiconductor diode with the high forward operation voltage will try to be driven by IC on the 3.3 V power supply, the driver circuit of the conventional configuration inevitably reveals a bias voltage shortage of internal transistors on IC, so that it is difficult to output the desired pulse waveform.

Additionally, the conventional countermeasure for overcoming the above problem involved great problems from the practical viewpoint, because it caused various drawbacks such as increase of the power consumption and impossibility of realizing one-chip ICs due to the need for adding external capacitors and/or inductor.

SUMMARY OF THE INVENTION

Based on recognition of these problems, it is an object of the invention to provide an optical semiconductor diode driver circuit reliably operating even with the supply of a source voltage slightly higher than a forward operation voltage of an optical semiconductor diode to be driven, capable to output a switched current and voltage large enough to drive the optical semiconductor diode, and realizing the ability of an arbitrary and variable setting of its output current with a high accuracy and compactness facilitating its design as a one-chip IC, and to provide optical connector coupled plastic optical transceiver modules. According to the invention, there is provided an optical semiconductor diode driver circuit comprising:

a pre-driver circuit including functions of amplification but limiting the maximum amplitude of the output voltage of the amplifier to a predetermined value, operating as a limiter-type amplifier, so as to amplify and shape an input pulse wave form and generate differential voltage pulses; and an output circuit responsive to the differential voltage pulse output from the pre-driver circuit to output externally a drive pulse current to an optical semiconductor diode as a load, the output circuit including a first transistor and a second transistor whose emitters are commonly connected at a common node; and both of a variable constant current source and a resistor connected to the common node, the differential voltage pulse outputs from the pre-driver circuit being input to the base of the first and the second transistors, the second transistor outputting a collector output current as the drive pulse current, when the voltage pulse input to the base of the first transistor exhibits a low level, the first transistor taking a cut-off state and the second transistor taking a constant-current on-state close to a saturated operation; when the input level of the voltage pulse rises to a high level, the first transistor taking a constant-current on-state close to a saturated operation and the second transistor taking a cut-off state; and in a transient state between the cut-off state and the constant-current on-state, emitter current feedback by the resistor being activated to switch sharply and mutually invert the state of the first transistor and the second transistor.

The above-summarized construction promises realization of a compact optical semiconductor diode driver circuit which operates with the power supply of a source voltage slightly higher than a forward operation voltage required for driving the optical semiconductor diode, can variably set the current output to the optical semiconductor diode at a desired value with a high accuracy, and is readily made as a single-chip IC.

The pre-driver circuit may further include a level shifter for adjusting the average output voltage level of the amplifier, and supplied with another power source different from the output circuit, the voltage of which being always maintained constant independently of operative condition changes of the circuit, the level shifter having a level shift resistor and a temperature-dependent constant current generating circuit to compensate temperature change of the switching voltage level of the amplifier.

This construction ensures a property of the output current pulse waveform to the optical semiconductor diode in which the pulse width and the transient response are maintained constant, and temperature dependency of the output current amplitude compensates optical output deterioration of LD against the change of operating temperature.

The variable constant current source of the output circuit may generate a specified current having a negative temperature dependency, the amplitude of the current pulse output from the second transistor being compensated to maintain a constant value even upon a change in temperature.

This construction ensures that the pulse current amplitude be maintained constant independently of the operative temperatures of IC.

Alternatively, the variable constant current source of the output circuit may generate a compensation current component having a negative temperature dependency in addition to a bias current component of a constant value, the amplitude of the current pulse output from the second transistor being controlled by the bias current component to maintain a constant value, and the amplitude of said current pulse being compensated by the compensation current component to maintain a constant value even upon a change in temperature. This construction ensures the capability of setting desired accuracy and value while maintaining the pulse current amplitude constant independently of operative conditions of IC.

Alternatively, the variable constant current source of the output circuit may include:

an emitter-grounded transistor of a size n which is connected in parallel between the common node and the ground connection;

a unit transistor of a size 1 including a collector connected to the common node and a base connected to the base of the transistor of the size n, in which a constant current in the amount of 1/(n+1) of a current value biased to said common node flows; and an error amplifying/feedback circuit network for supplying a feedback signal to the base of the transistor of the size n and the base of the transistor of the size 1 to always maintain zero as the voltage difference between the emitter of the unit transistor and the ground connection.

This construction ensures realization of high-accuracy current adjustment function increasing the reference current accuracy and decreasing influences from changes in current amplification ratio or fluctuation in source voltage caused by fluctuation of the load when a small-current negative power source is usable.

Alternatively, the output circuit may further include a constant current generator connected to the collector of the second transistor to add a DC bias current of a constant value to the drive pulse current.

This construction makes it possible to add a temperature-dependent current generating circuit for precisely controlled LD DC bias in form of a compact circuit arrangement to thereby ensure good high-frequency operation of LD.

Additionally, another optical semiconductor diode driver circuit according to the invention has a construction similar to a Schmitt circuit as one of its features, as listed below.

That is, according to the invention, there is further provided an optical semiconductor diode driver circuit comprising: a pre-driver circuit including both functions of amplification and limiting the amplitude of the output voltage of the amplifier to a predetermined value, operating as a limiting amplifier, so as to amplify and shape an input signal and generate a voltage pulse; and an output circuit responsive to the voltage pulse output from the pre-driver circuit to output externally a drive pulse current to an optical semiconductor diode as a load, the output circuit including a first transistor and a second transistor whose emitters are commonly connected at a common node; and both of a variable constant current source and a resistor connected to the common node, the differential voltage pulse output from the pre-driver circuit being input to the base of the first transistor, the second transistor outputting a collector output current as the drive pulse current.

The current output circuit can be operated by any of two kinds of systems. One of them is a system to have the collector-emitter voltage of the switch transistor to execute switching operation in the saturation mode region. The other is a system to have the collector-emitter voltage execute switching operation within the non-saturated mode region.

In the non-saturated system, the circuit is implemented with a proper bias setting of the high level of the base input pulses by the pre-driver circuit and a voltage dividing resistor network carefully optimized in its value. In this manner, the circuit executes a non-saturated operation in the current-switch-on state to make the output pulse amplitude a certain constant. With the non-saturated current switching operation, it is possible to realize the operation including the function of regulating the current pulse amplitude dependent on the setting.

Typically, an independent circuit using a base-grounded transistor amplifier to output from the collector a constant current regulated by the base bias voltage and the emitter load resistor is for the basic constant current generating circuit. In contrast, the invention attains the operation mode for outputting a constant current in a period of the pulse high state and for reducing the output current to zero in a period of the pulse low state by driving the base with a rectangular pulse instead of normally fixing the base voltage bias.

Alternatively, the optical semiconductor diode driver circuit according to the invention comprises: a pre-driver circuit including both functions of amplification and limiting the amplitude of the output voltage of the amplifier to a predetermined value, operating as a limiting amplifier, so as to amplify and shape an input signal and generate a voltage pulse; and an output circuit responsive to the voltage pulse output from the pre-driver circuit to output externally a drive pulse current to an optical semiconductor diode as a load, the output circuit including a first transistor and a second transistor whose emitters are commonly connected at a common node; and both of a variable constant current source and a resistor connected to the common node, the differential voltage pulse output from the pre-driver circuit being input to the base of the first transistor, the second transistor outputting a collector output current as the drive pulse current, when the voltage pulse input to the base of the first transistor exhibits a low instantaneous level, the first transistor taking a cut-off state and the second transistor taking a saturated state or a constant current on-state, when the input level of the voltage pulse rises above a predetermined value, the first transistor taking a saturated state and the second transistor taking a cut-off state, in a transient state between the cut-off state and the saturated state or the constant current on-state, positive feedback being activated to rapidly switch and invert the first transistor and the second transistor.

That is, the input signal is first input to the pre-driver circuit, and then amplified and shaped into a rectangular pulse signal having an amplitude optimum for driving the output circuit stage. The pre-driver circuit is basically a differential limiting amplifier, in which the amplitude has a substantially constant value and an output pulse with smaller rise and fall time constant is obtained. Moreover, the high level voltage of the output pulse regulates the peak value of the amplitude of the output pulse current from the final stage output circuit.

The limiting amplifier circuit contains a level shift resistor therein, and the DC level of the output pulse voltage is designed to have a property of maintaining its high level at a constant value or decreasing the high level with temperature by adding a slight amount of positive temperature coefficient to the voltage generated in the level shift resistor, thereby to decrease temperature change of the input discrimination level of the output stage switch circuit transistor. The shaped and amplified voltage pulse signal is input to the output circuit in form of an emitter-coupled pulse amplifier whose basic circuit arrangement is similar to a Schmitt circuit, and it is converted to supply an ON/OFF modulated pulse current to LD connected to the output-side transistor as an external load.

In case of the saturated-type switch circuit, the collector-emitter voltage of the output circuit transistor is operated in the completely saturated mode region.

However, in case of the non-saturated switching system, the first and second transistors in the current switch output circuit changed between two states, namely, the off-state blocking the current and the on-state in which the collector-emitter voltage does not drop to the saturation voltage, and a constant current flows while maintaining a constant voltage enabling normal operation of the transistor.

More specifically, in the output circuit, a pre-driver output pulse signal voltage is input to the base of the first transistor, and a resistor is connected to its collector as a load. At the connection point of the collector and the load resistor, one terminal of the second resistor is connected and the other terminal of the second resistor and the third resistor are connected in series and then to the ground, and the base of the second transistor is connected to the node of the second and third resistors. In order to improve the transient response of the output waveform by efficiently transferring a high-frequency components to the base, a capacitance is provided in parallel with the second resistor.

Emitters of the first and second transistors are commonly connected, and then to the ground potential via a fourth resistor. Therefore, it is a kind of pulse amplifier to which current feedback is applied by the impedance of the fourth resistor. At the common node of the emitters, a constant current source is connected additionally, and by appropriately adjusting the current value generated therefrom, control is made to ensure a current of a desired value to flow to LD connected as an external load, using the collector terminal of the second transistor as the output.

In case of the saturated-type switching circuit system, values of the second and third resistors are determined basically to feed the sufficient base bias current to cause a saturated operation of the second transistor. If there is no constant current source connected to the common emitter, the current value flowing in LD is determined by the external supply source voltage, diode forward matching voltage and internal operation resistance as electric properties of LD, and the value of the fourth resistor.

In the non-saturated type switching operation circuit, the output current applied to LD is determined by a current summing a current made by dividing the emitter voltage of the second transistor, whose base voltage is fixed by divisional voltages of the second and third resistors, by the fourth resistor value and an output current value of the constant current source connected in parallel to the fourth resistor.

Especially when the output load current is changed, the output current pulse width also is modified due to a change in mean base injection current of the second transistor. However, by optimizing the base bias voltage of the second transistor, modification of the output pulse width can be minimized. To realize it, a method of injecting to the node of the second and third resistors a current bias of a fractional value proportional to the constant current source connected to the common emitter.

In case of the saturated-type switch output circuit, it is just a Schmitt circuit when the collector load of the second transistor in the output circuit is a pure resistor. However, since it is LD different from a pure resistor, the impedance largely varies with operational conditions, the current injected to LD largely varies with change of power source voltage and/or operating temperature.

The constant current source connected to the common emitters is implemented with the role of realizing a property of always maintaining a desired output current value preset in LD by adjusting the pulse amplitude of the on/off current and simultaneously adjusting the output current value appropriately according to changes of the operational environment such as power supply voltage or temperature variation. As a result, behaviors of the output circuit are substantially equivalent to those of a Schmitt circuit, and the high/low discriminating level for the input voltage exhibits a certain hysteresis, and a rectangular pulse with a small transient response time is obtained at the output end. Needless to say, these specific numerical values of the characteristics may depend on the actual design of the circuit. While the constant current source basically has an output impedance of a very large value, the value of the fourth resistor connected to the common emitter is a small value. Therefore, the impedance between the common emitters and the ground is not affected by the output value of the constant current source.

Although the contents set forth in the foregoing paragraphs are not directly applicable to the non-saturated type switch circuit, the non-saturated switch circuit can also work similarly. In that quick logic inversion sequences upon transient response operation of the switch, a current positive feedback is happened effectively, so that the circuit exhibits a hysteresis between the input on and off transition levels and behaves similarly to a Schmitt circuit, and also that the high-frequency operation property is not affected by load variation of the constant current source regarding the emitter current feedback property. Additionally, when a capacitance is added in parallel with the emitter resistor as explained below, it operates as peaking to the transient response. The peaking capacitance value optimum therefor may be determined as the value obtained by subtracting the parasitic capacitance and the collector effective capacitance in the constant current circuit from the ideal optimum capacitance value connected intentionally.

Basically, in the output stage circuit, operation of the output transistor is not stayed within the linear active region but limited by the on/off saturated regions in the saturated switch output circuit system. On the other hand, in case of the non-saturated switch system, on/off modulated pulse current alone is also permitted to flow in LD as the external load because the output transistor takes either a cut off state or the current-on-state where the collector-emitter voltage keeps finite nearly in the saturated region. On the other hand, in order to ensure a high-frequency property of LD, it is necessary to always apply a DC bias current up to the proximity of the threshold of LD.

To meet this requirement, there is a usual method for supplying a DC current bias from the exterior. However, since it must be supplied with high impedance at high-frequency ranges without pulse distortion, it is indispensable to use an expensive and large part like a bias T, so that a low-cost and compact optical transmitter cannot be realized. To overcome this problem, it is effective to use the method of implementing a constant current source inside IC and directly connecting it to the collector terminal of the output transistor.

Additionally, by combining a capacitance in parallel with the fourth resistor and implementing a time constant of 1 ns or less so as to apply high-frequency peaking to the amplification gain of the output circuit, reduction of the transient response time of the rectangular pulse output waveform and increase of the maximum operation frequency can be realized.

In the case where the pre-driver circuit of the emitter follower output is simply connected to the final stage output circuit, there is produced a property in which the base-emitter voltage drops with increase of the temperature, the discrimination level shifts, the current pulse width loaded to LD changes, and the pulse duty ratio of the transmission waveform changes.

In order to prevent substantial change of the discrimination level, the level shift resistor of the pre-driver circuit may be configured to generate an opposite voltage change large enough to just compensate the temperature variance of a number of equivalent diodes corresponding to a half of the total number of transistors used in the emitter follower of the pre-driver circuit. In order to implement the voltage drop a positive temperature coefficient, a constant current source having a positive temperature coefficient may be additionally connected to the common node of two collector load resistors of a differential limiting amplifier and the level shift resistor such that the product of the current changing rate and the level shift resistor value coincides with the value obtained by multiplying approximately 1.2 mV/°C. per unit diode by the number of the equivalent diodes.

Although the non-saturated switch output circuit system basically operates in the same manner, it is necessary not only to prevent change of the pulse width duty ratio but also to prevent variation of the current amplitude of the output. In order to control the LD output current itself desirably, there are the emitter current, resistance ratio of voltage divisional network, temperature-dependent bias value applied thereto, and so forth, as parameters to be adjusted. Some different kinds of circuit systems may be designed, according to which combination of the parameters should be selected.

Although the frequency bandwidth of a pnp transistor is usually a problem depending on usable processes, it is much smaller than that of an npn transistor at least by one digit. In the case where. a pnp transistor cannot be used as the constant current source directly connected to the common emitters of the output circuit due to the high frequency characteristics, the use of the constant current circuit becomes difficult. To overcome this problem, it is effective to connect the collector and the emitter of an npn transistor between the common emitter and the ground connection and introduce a feedback voltage of an error amplifier into the base to control it. That is, the transistor making up the current source must have a size corresponding to an expected maximum amount of current generation, and one with the size as large as n times the basic transistor is used. Simultaneously, another transistor of the basic size is commonly connected to the collector and the base, and the emitter is connected to a negative reference power source via a reference resistor.

By appropriately selecting values of the reference voltage and the reference resistor, a current $1/(n+1)$ of the current value desirable to set as the current source is ensured to flow. When it is desirable that the determined current Icd has a certain property, the reference voltage is designed to have a property of changing by the same rate.

In this circuit configuration, control is made by amplifying the error voltage so as to always maintain zero of the voltage difference between the node of the emitter and the reference resistor and the ground potential, and feeding it back to the base voltage.

If the maximum collector current is selected such that collector-emitter voltage making the voltage vs. current characteristics of the basic transistor to avoid the saturation property be larger than the terminal-to-terminal voltage of the fourth resistor, then it is possible to increase the operation impedance to a value as large as tens times the value of the fourth resistor even when (n+1) basic transistors operate in parallel, and substantially the same electrical property as that obtained by connecting the constant current source can be maintained.

Although it is different from the above-explained constant current generating circuit system using the negative power source in a strict sense, it is possible to use a constant current circuit employing a current mirror circuit as a circuit system quite similar to the said circuit from the viewpoint of the basis of operation of the constant current circuit and not using the negative power source. However, attention is paid to the difference between these two systems.

The former, not using pnp transistors typically with a low cut-off frequency, has merit with a wider band and also demerit of its need of a negative voltage reference source. In contrast, however, it has the features that the use of the negative voltage enables a higher accuracy of the reference current, changes in the output current caused by fluctuation of the load are small as excellent characteristics of a typical npn transistor, and influences from variation of the source voltage are also small.

On the other hand, as to the latter, it is important features that it can operate with a single power source only and can be made easily as a one-chip IC.

When the LD driver circuit is used, it is possible to realize a transceiver module coping with a low power voltage source, which is operable even with a small difference between the forward applied voltage of LD and the source voltage.

The transmitter module contains a sub-module collectively packaging on a substrate an IC incorporating the LD driver circuit, LD, capacitors, resistors, and so forth, as additional parts for complete operation of the module, and it is molded in a plastic package by collective molding, having including leads for electrically coupling and an optical connector for optically coupling to the optical fiber cables.

As a result, a compact transmitter module has been realized, which operates with a single power source commonly used to supply a source voltage to other signal processing ICs, and decreases the consumption power low enough to permit use of a small heat sink or no use. By simultaneously packaging an optical receiver on the sub-module, an optical transceiver having the same features can be realized.

The invention enables realization of a compact optical semiconductor drive circuit easy to make as a one-chip IC, which stably operates only with the supply of a source voltage slightly higher than a forward operation voltage of an optical semiconductor diode to be driven, and can variably determine the current output to the optical semiconductor diode at desired accuracy and value.

As a result, the invention can inexpensively provides a compact optical connector coupled plastic optical transmitter and transceiver modules which operates with a single power source commonly used to supply a source voltage to other signal processing ICs, and decreases the consumption power low enough to permit the use of a normal design for heat radiation.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a circuit diagram schematically showing a basic circuit arrangement according to the invention;

FIG. 3 is a diagram schematically showing a circuit including a standard-type constant current generating circuit at a location nearer to a power source;

FIG. 4 is a diagram schematically showing a circuit including a constant current generating circuit at a location nearer to a ground connection in form of a mirror circuit;

FIG. 5 is a circuit diagram schematically showing an example including a constant current generating circuit at a location nearer to a ground connection in form of two-stage mirror circuits;

FIG. 7 is a circuit diagram schematically showing an example including a constant current generating circuit for temperature compensation and amplitude adjustment;

FIG. 9 is a circuit diagram schematically showing a basic circuit arrangement according to the invention;

FIG. 12 is a diagram schematically showing a circuit including a temperature-dependent constant current generating circuit;

FIG. 14 is a diagram schematically showing a circuit including a LD DC bias constant current generating circuit therein;

FIG. 16 is a diagram schematically showing a circuit suppressing fluctuation in time margin of its output pulse;

FIG. 17 is a diagram schematically showing a circuit packaging a current generator made up of npn transistors;

FIG. 18 is a diagram schematically showing a circuit including a constant current generating circuit in a location nearer to a ground connection in form of a current mirror circuit;

FIG. 20 is a circuit diagram schematically showing an example including a constant current generating circuit near a ground connection in form of two-stage mirror circuits;

FIG. 22 is a diagram showing the waveform of a LD pulse load current output appearing when the example of the constant current generating circuit of FIG. 21 does not include the bias compensating circuit;

FIG. 23 is a diagram showing the waveform of the LD pulse load current output appearing when the example of the constant current generating circuit of FIG. 21 includes the bias compensating circuit;

FIG. 26 is a perspective see-through view of a central part of an optical connector coupled type plastic optical transceiver module;

FIG. 27 is a circuit diagram schematically showing a conventional optical semiconductor drive circuit; and FIG. 28 is a diagram showing voltage-current characteristics of a typical npn transistor.

DETAILED DESCRIPTION OF THE PREFERRED EMBODIMENTS

Figure 2:
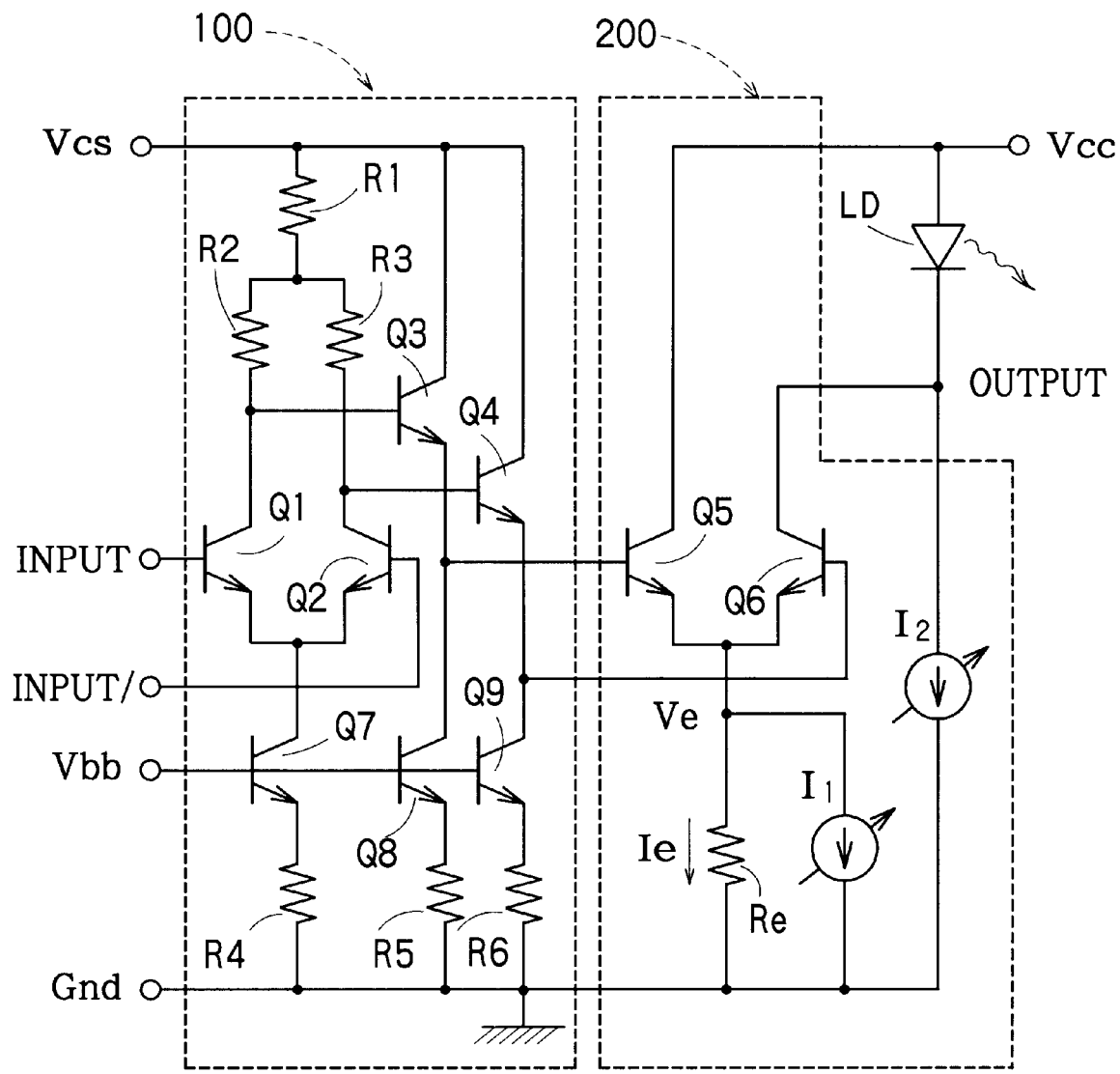
FIG. 2 is a circuit diagram schematically showing a basic circuit arrangement added with a DC bias according to the invention.

With reference to the drawings, embodiments of the invention are explained below in detail.

Embodiments explained with reference to FIGS. 1 to 8 each include a differential amplifier type circuit made up of two transistors Q5 and Q6 in its output circuit 200. One of features of the differential amplifier circuit lies in having both a current switching function and a constant current generating function. Any of these embodiments sufficiently attains the aforementioned object of the invention, and at the same time, it has the advantage that distortion in output pulse width is small even when bias voltage adjustment inside the circuit is not set so precisely and the transient responsive change in amplitude until the output amplitude restores its constant value after a burst input is in a negligible level.

One of features of embodiments explained with reference to FIGS. 9 to 25 lies in the output circuit 200 having a basic construction similar to a Schmitt circuit. These embodiments also attains the aforementioned object of the invention sufficiently. They are also characterized in adjusting the rise time and fall time of the output pulse in a trade-off relation.

Further classifying the embodiments of FIGS. 9 to 25, output circuit transistors according to the embodiments shown in FIGS. 9 to 17 execute substantially completely saturated switching operation. In contrast, output circuit transistors according to the embodiments shown in FIGS. 18 through 25 are characterized in that the operation is positively extended to a non-saturated operation region.

When a transistor is activated for saturated operation, the output pulse width expands from the input pulse width, depending upon the depth of saturation of the transistor, and the value of the operation impedance of a load LD directly affects the output current value. In contrast, if the it is shifted to a non-saturated operation point as shown in FIGS. 20 to 25, then the controllability of the output pulse current characteristics can be improved significantly. On the other hand, in the embodiment explained with reference to FIG. 26, an optical transceiver module incorporating a drive circuit in any of the embodiments of FIGS. 1 through 25 is provided.

FIG. 1 is a circuit diagram schematically showing construction of an optical semiconductor diode driver circuit according to an embodiment of the invention. The drive circuit shown here is a circuit for introducing differential input signals and outputting a current pulse for driving LD. It includes a pre-driver circuit 100 and an output circuit 200. Differential input signals INPUT and INPUT/ are introduced into bases of transistors Q1 and Q2 of the pre-driver circuit 100. A collector current output of a constant current circuit made up of a transistor Q7 supplied with Vbb as its reference voltage input and a resistor R4 is connected to a common emitter of the differential amplifier transistors Q1 and Q2.

Connected to collectors of Q1 and Q2 are load resistors R1 and R2 equal in value, and they are commonly connected and then connected to a power source Vcc via a level shift resistor R3. When the differential transistor amplifier is fed, outputs of Q1 and Q2, shaped into almost rectangular pulse waveforms having a certain amplitude larger than a degree making the transistor supplied with a low-level signal to enter in the cut-off region when the transistor supplied with a high-level signal is in the operation region, are power-amplified in an emitter follower circuit made up of transistors Q3, Q4, Q8, Q9, resistors R5, R6, and introduced as a signal into a transistor of the output circuit 200. The pre-driver circuit 100 is equivalent to a limitting amplifier in its operation, and its basis construction is substantially the same as the pre-driver circuit in the conventional circuit shown in FIG. 27. The voltage to be generated in the level shift resistor R1 may usually be set to fall in a certain voltage range in order to make the next-stage output circuit internal operation bias point to be adjusted to an optimum value. In this case, however, in order to attain a special function explained below, it is indispensable that the circuit has characteristics required for the purpose.

The differential rectangular pulse signals shaped and amplified by the pre-driver circuit 100 are introduced into the output circuit 200, and finally output as a current output on/off-modulated for pulse-current-driving LD. The output circuit 200 is a differential amplifier as its basic circuit arrangement.

More specifically, in response to the differential signals input to bases of the transistors Q5 and Q6, the high-level-side transistor introduces the total current of the current Ie flowing in a resistor Re connected to the common emitter and the current flowing in a constant current source I1, and behaves to make the collector current of the low-level-side transistor zero.

Since the emitters of the transistors Q5 and Q6 are connected commonly and connected to a ground potential via the resistor Re, the current flowing in Re becomes (Vh−Vbe)/Re which is a value obtained by dividing by Re the value as a result of subtracting the base-emitter voltage Vbe from the high level Vh of the base input pulse. In a configuration maintaining the emitter voltage (Vh−Vbe) constant, the pulse current output amplitude to LD becomes constant independently from operation conditions, and the circuit operates as a constant current circuit for pulse currents.

In this manner, the differential amplifier circuit made up of Q5 and Q6 has. both a current switching function and a constant current generation function as one of important features thereof. Additionally, since the constant current source is also connected to the common emitter connection point of Q5 and Q6, by adjusting the current value I1 flowing in the constant current source, the circuit can be controlled so that a desired value of current amplitude be output to LD connected as an external load, using the collector terminal of the transistor Q6 as the output. Therefore, it is the pulse peak voltage inputting into the bases of the transistors Q5 and Q6, i.e., the logic high level of the pre-driver circuit output, that determined the current value of the constant current output, and it is necessary to maintain the voltage at a constant value.

The requirement for maintaining a constant value can be realized by stabilizing the source voltage Vcs for driving the pre-driver circuit, simultaneously making the output current of the constant current generating circuit made up of the bias voltage Vbb, resistor R4 and transistor Q7 to have a certain positive temperature coefficient, additionally optimizing the value of the level shift resistor R1, and making the voltage generated at opposite ends of R1 to have a positive temperature coefficient of approximately 1.2 mV/°C. so as to cancel the negative temperature coefficient of approximately 1.2 mV/°C. corresponding to the temperature dependency of the base-emitter voltage of Q3 and Q4. This is the special performance required in the pre-driver circuit, which is different from the conventional circuit. For obtaining a strict constant current output, a temperature coefficient twice this is needed in first approximation. Actually, it is smaller than the twice value because the current amplification ratio of the transistor also changes. If the setting of the pre-driver is used as it is, then it exhibits a current change rate similar to the characteristic temperature representing a decrease in optical conversion efficiency of LD. Therefore, it can be used to stabilize the feed forward optical output of LD. Additionally, although the pulse property changes in response to changes in current amplification rate with a change in temperature, it has been confirmed that the aforementioned setting of the pre-driver is optimum to minimize the change. Therefore, control of the constant current source I1 provided in parallel is more excellent as means for obtaining a strict constant current output.

Under the condition where the forward voltage drop of LD is 2.5 V and the voltage of 0.35 V is ensured as the collector-emitter voltage when Q6 is ON, the above-explained operation is sufficiently possible even when the source voltage is 3.0 V because the voltage of 0.15 V remains between terminals of Re.

FIG. 3 is a circuit diagram schematically showing an exemplary circuit connecting a concrete constant current source from the side of the power supply voltage Vcc. That is, a constant current source output transistor Q100 is connected to opposite ends of LD, and a controlled voltage Vic is input to the base of the transistor Q100 so as to generate I1 having the characteristics satisfying the aforementioned requirement.

Whilst the output impedance of the constant current source is usually as large as hundreds of k, the resistance value of Re connected to the common emitter is hundreds of maximum, and typically as small as decades of or less. Therefore, the resistance value between the common emitter and the ground connection is not affected by the preset value of the operation current of the current source, and the circuit operates substantially as a differential amplifier connecting the resistor Re between the common emitter and the ground connection. This example of circuit arrangement can be controlled to restrict the maximum output current to LD by (Vh−Vbe)/Re and output a smaller output current to LD. FIG. 4 is a circuit diagram schematically showing a concrete example of the circuit of FIG. 2, made by connecting a constant current source using a mirror circuit.

That is, a constant current source I10 connected to Vcc feeds a transistor Q11, and the current is mirror-inverted and output from the collector of Q10. If a transistor with a larger size than Q11 is selected as Q10, the current is amplified and a larger current can be output as much as the increased ratio in size. It is sufficient for the output impedance of Q10 to be sufficiently smaller than the resistor Re, and the collector voltage of Q10, which is the common emitter voltage of Q5 and Q6, may exhibit a substantially constant value even if the operation region of Q10 slightly overlaps the saturated operation region. It was actually confirmed that the circuit was operable without any problems even when the collector-emitter voltage decreases to approximately 0.2 V. Additionally, oppositely from the circuit shown in FIG. 3 which moves toward decreasing the LD output current when the constant current is increased, the embodiment shown here can increase the output current. Its maximum value is limited by the current capacitance the high-frequency property of the output transistor Q6 can maintain, and the diode forward voltage drop of LD. It is apparently a version not departing from the scope of the invention to use a circuit improved in linearity of the current transmission property by connecting an amplifier circuit made up of Q12 and R7 as shown in FIG. 4, for example, in order to alleviate the dependency of the amplification ratio of the current mirror circuit upon the output current value and the transistor property.

FIG. 5 is a circuit example modified from FIG. 4 by additionally using a single step current mirror circuit and using the output current Iac from the constant current generating circuit made up of a control voltage Vac, resistor R9 and Q16. After the appropriately amplified Iac is transferred through the two-stage mirror circuits, a constant current can be injected to the emitter of the output transistor Q6 after being. Therefore, the value of Iac may be small, and the constant current generating portion can be realized as a circuit compact and less affected by its own generated heat. Moreover, by combining the dependency of the control voltage Vac on the temperature with the dependency of the base-emitter voltage of Q16 upon the temperature, it is also possible to generate a constant current independent from the temperature as far as Iac is concerned. Additionally, the control property of Vac may be changed as shown in FIG. 1 to implement Iac a negative temperature coefficient and to cancel changes in current flowing in Re. When the value of R9 connected to the ground potential, a value inversely proportional to it can be obtained as the current Iac. Therefore, the circuit is readily available whichever the adjustment of the pulse current amplitude is provided inside the chip or outside the chip.

Figure 6:
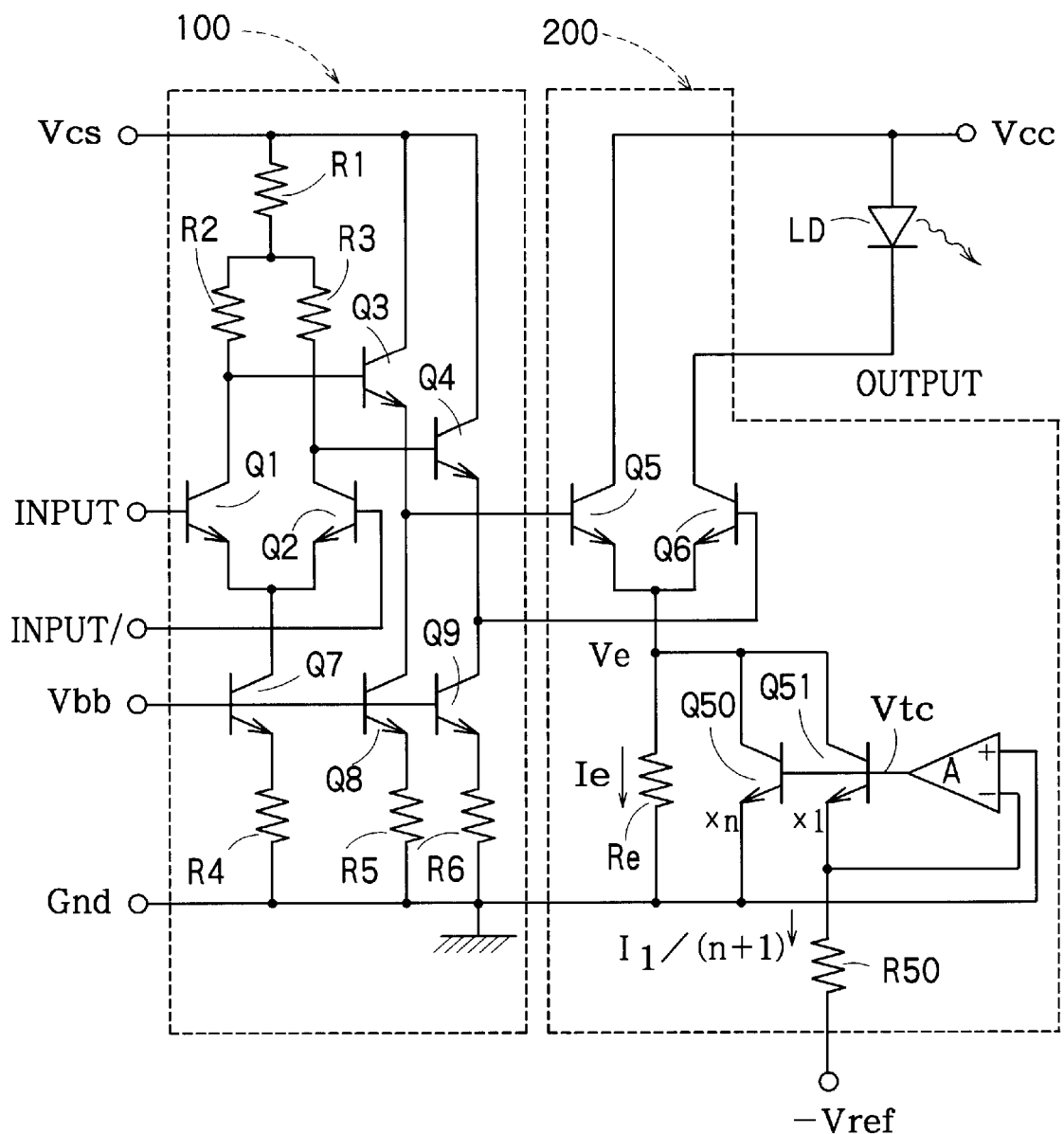
FIG. 6 is a diagram schematically showing a circuit packaging a current generator made up of npn transistors using a negative power source.

In case that a small-capacity negative power source is usable in the circuit, the circuit arrangement shown in FIG. 6 can be employed. That is, here is effective a control system, as shown in FIG. 6, where the collector and the emitter of an npn transistor Q50 is connected between the common emitter and the ground connection, and a feedback voltage Vtc of an error amplifier A is input to the base. As the transistor Q50 used here to form the current source, one with a size corresponding to the expected maximum current amount to be generated is required, and one with the size as large as n times the basic transistor is used. Simultaneously, another transistor Q51 of the basic size is commonly connected to the collector and the base, and the emitter is connected to the negative reference voltage −Vref via the reference resistor R50. By appropriately selecting values of the reference voltage Vref and the reference resistor R50, a current 1/(n+1) of the current value I1 desirable to set as the current source is ensured to flow. When it is desirable that the determined current I1 has a certain property, the value of −Vref is designed to change by the same ratio.

In this circuit arrangement, the circuit is controlled by feeding back to the base the voltage Vtc made by amplifying the error voltage in the amplifier A so that the voltage difference of the common node of the emitter of Q51 and the reference resistor R50 from the ground connection be always zero. As a result, the total current flowing into the collectors of Q50 and Q51 is always I1. By selecting an appropriately large value for n, the maximum collector current can be reduced adequately so that the collector-emitter voltage bringing the voltage vs. current characteristic of the basis transistor to the saturated characteristic (the voltage near the shoulder where the initial rise changes to a moderate rightward rise in FIG. 12) be larger than the voltage between both terminals of the resistor Re. At that time, the operation impedance with which (n+1) basic transistors are operating in parallel can be increased as large as tens times of the value of the resistor Re at worst, and the same property as that by connecting the constant current source can be maintained substantially.

This embodiment has characteristics such as small changes in current amplification factor upon fluctuation in load, no influence from variation in power source voltage, for example, in addition to a high accuracy of the reference current, because a negative reference voltage can be used. This circuit has been explained as being applied to a constant current circuit for adjustment of the pulse current; however, it is also applicable as a constant current circuit for the DC bias current.

Shown in FIG. 7 is a circuit example spread from the embodiment shown in FIG. 5 to obtain a constant pulse amplitude and transient response waveform over the entire operative condition range. A difference between the output current of the constant current circuit made up of R13 using the control voltage Vac and Q24 and the source current of the constant current circuit made up of R11 using the control voltage Vct and Q20 is injected as the collector current of Q18, and the output current Ict amplified in Q17 is the reference current for canceling changes in current flowing in Re by giving the constant current I1 a negative temperature coefficient as shown in FIG. 1. By combining this with Iac maintaining a constant output independently of the operation conditions, the final current I1 is output from the collector of Q10. This is the circuit arrangement of this embodiment.

In this embodiment, if the value of R9 alone is finally adjusted, the pulse amplitude of the output transistor Q6 is definitely determined and output, and it is maintained constant independently of the operating conditions. Simultaneously, the circuit is characterized in maintaining the width of the pulse waveform and the transient response properties thereof, such as rise and fall time, at constant values. As explained above, operation of the output transistor in the output circuit 200 is not stayed to its linear region, but restricted to both of the saturated or cut-off regions.

Therefore, the current output from the collector output terminal to the load LD is the on/off rectangular pulse current, and does not contain a DC current bias component.

However, in case of an optical semiconductor diode whose high-frequency modulation property is ensured only by always applying a DC bias current near the threshold value of LD, the use of the DC bias supply circuit is indispensable. Theoretically, it is possible to employ a system of simply supplying a DC bias current from the exterior. However, since a pulse current signal is also input simultaneously to the terminal of the DC bias current injected to LD, it is necessary to connect it with LD with a high impedance in terms of a high frequency in order to avoid a pulse form degradation. A bias T is normally used as means for realizing it, but it is an expensive additional part with a large size.

FIG. 2 is a circuit diagram schematically showing construction of an optical semiconductor diode driver circuit according to the embodiment directed to avoiding the use of such an additional part. That is, as illustrated there, it is effective to employ the method of providing a constant current source I2 within the circuit and connecting it directly to the collector terminal of the output transistor.

Figure 8:
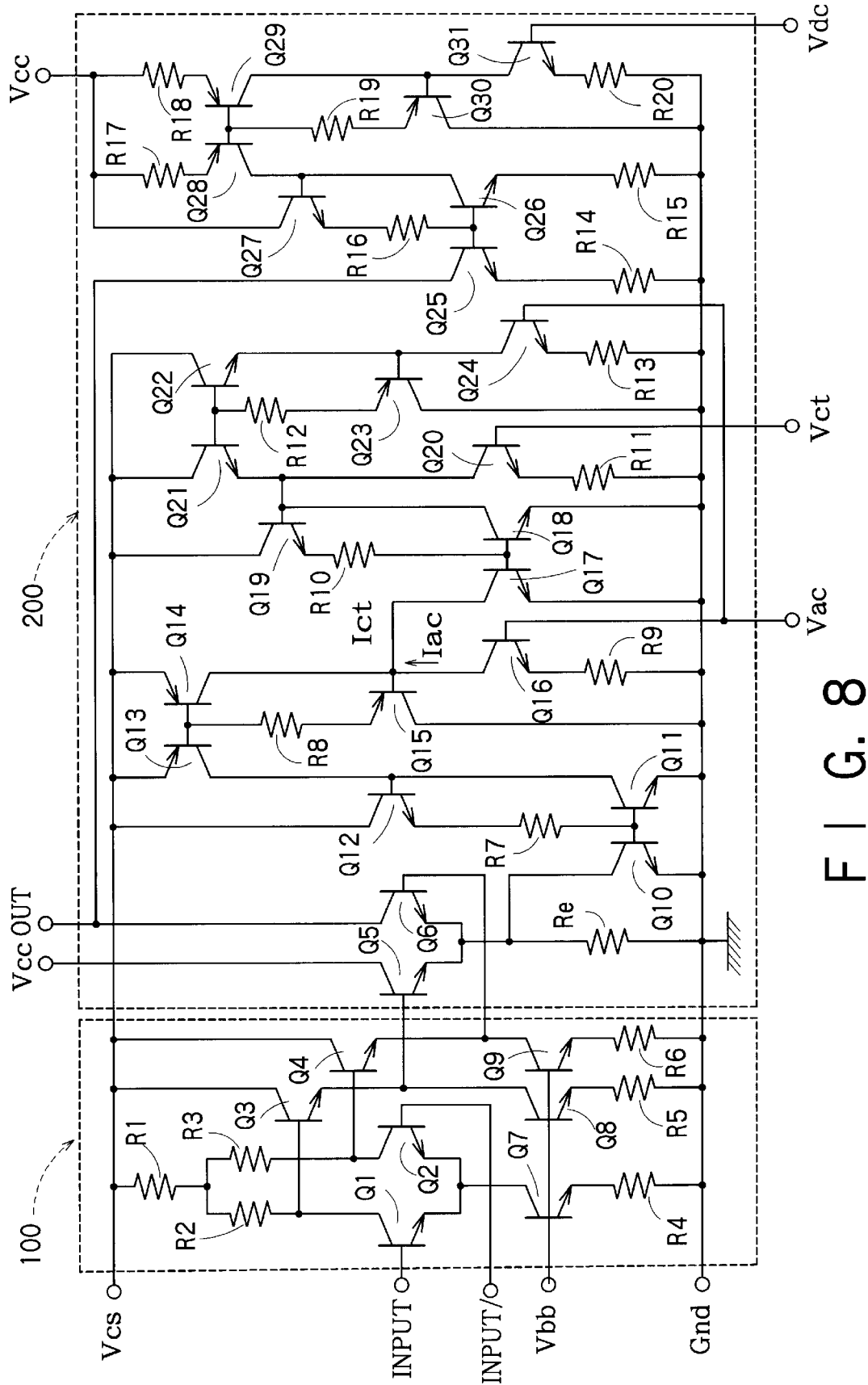
FIG. 8 is a circuit diagram schematically showing an example including a DC bias circuit in addition to the constant current generating circuit for temperature compensation and amplitude adjustment.

FIG. 8 shows a concrete circuit arrangement of FIG. 2. This is a circuit extended from FIG. 7. Contents of the circuit already explained with reference to FIG. 7 are omitted from the following explanation, and the DC bias circuit is explained together with its peripheral circuits.

Basically, a control voltage Vdc shown in a temperature-dependent constant current generating circuit proposed by the Inventor in Japanese Patent Application No. H10-42109 is used as means for compensating the threshold temperature characteristics of LD to generate a current Idc exponentially changed in value relative to changes in temperature by the temperature-dependent constant current generating circuit made up of R20 and Q31. This is amplified in the two-stage mirror-inverted current amplifier, and output from Q25 collector as the DC bias I2 of a desired value. Since the control range of the DC bias current is large, here is used Vcc larger than Vcs as the power source of the amplifier. Furthermore, in addition to alleviation of changes in transmission characteristics by Q27 and Q30, by providing emitters of mirror transistors with current feedback resistors R14, R15, R17, R18 having values inversely proportional to the transistor sizes, influences from changes and fluctuation in transistor characteristics and fluctuation in source voltage are alleviated.

As described later in detail referring FIG. 18, in a circuit employing a current mirror a current gain is determined by the size of the mirror transistors. For example, when the size of the one transistor is 1 (unit size) and the size of the another transistor is n, the current is amplified by n times by inputting a current to the transistor having the size of 1 then by mirroring the current to output from the transistor of the size of n. If the input current is larger than the upper limit of the transistor of the size of 1, the sizes of the transistors should be increased in order to meet the input current, up to the sizes larger by m times, for example. That is, by increasing the size of the one transistor up to m and by increasing the size of the another transistor up to (m×n), the current capacity can be improved while keeping the current gain.

Details of the circuit for generating Vdc are disclosed in the specification of Japanese Patent Application No. H10-42109, and not repeated here. However, it is important to determine the value of the resistor R20 connected to the emitter of the constant current output transistor Q31 small enough to ensure that the internal voltage of the mirror current amplifier circuit causes no problems in operation. The circuit shown in FIG. 8 compensates the temperature characteristics of the LD threshold value very precisely. Therefore, if an IC chip having formed such a temperature-dependent constant voltage generating circuit is mounted together with LD on a carrier with a good thermal conductivity to hold it under the same temperature, temperature compensation can be performed very precisely. Drive circuits each including a differential amplifier circuit made up of two transistors Q5 and Q6 in its output circuit 200 have been explained heretofore with reference to FIGS. 1 through 8.

Next explained with reference to FIGS. 9 through 25 are drive circuits similar to a Schmitt circuit and having an output circuit transistor operative for substantially complete saturated switching operation.

FIG. 9 is a circuit diagram schematically showing construction of an optical semiconductor diode driver circuit according to an embodiment of the invention. The drive circuit shown here is a circuit for introducing differential input signals and outputting a current pulse for driving LD. It includes a pre-driver circuit 100 and an output circuit 200.

Differential input signals INPUT and INPUT/ are introduced into bases of transistors Q101 and Q102 of the pre-driver circuit 100. A collector current output of a constant current circuit made up of a transistor Q103 supplied with Vbb as its reference voltage input and a resistor R104 is connected to a common emitter of the differential amplifier transistors Q101 and Q102. Connected to collectors of Q101 and Q102 are load resistors R101 and R102 equal in value, and they are commonly connected and then connected to a power source Vcc via a level shift resistor R103. Output of Q102 shaped into a almost rectangular pulse waveform with a certain amplitude is power-amplified in an emitter follower circuit made up of transistors Q104, Q105 and resistor R105, and introduced as a signal into a transistor of the output circuit 200. The pre-driver circuit 100 is equivalent to a limiting amplifier in its operation, and its basis construction may be substantially the same as the pre-driver circuit in the conventional circuit shown in FIG. 27.

If the input signal is a single-phase signal instead of differential signals, the DC voltage to the input terminal for INPUT/ may be a voltage corresponding to the middle point of the amplitude of the input pulse signal to the input terminal for INPUT whilst a single-phase input pulse signal is input to the INPUT side. When an opposite-phase signal is desired as the optical output, INPUT and INPUT/ may be connected inversely.

Since the signal required for the signal state output circuit is basically a single-end signal alone instead of differential signals, it is not indispensable for the pre-driver circuit to generate differential signals. Therefore, for the purpose of obtaining a signal gain as large as possible, R1 may be set to zero. However, if R1 is simply set to zero, the function as the limiter amplifier is lost, and the problem of fluctuation in output pulse amplitude may occur. In order to reliably overcome this problem, if any, there may be connected an element like a diode or a circuit network having the property of that the impedance suddenly decreases, amplification is saturated, and the amplitude is limited, under a voltage above a certain voltage value.

Figure 10:
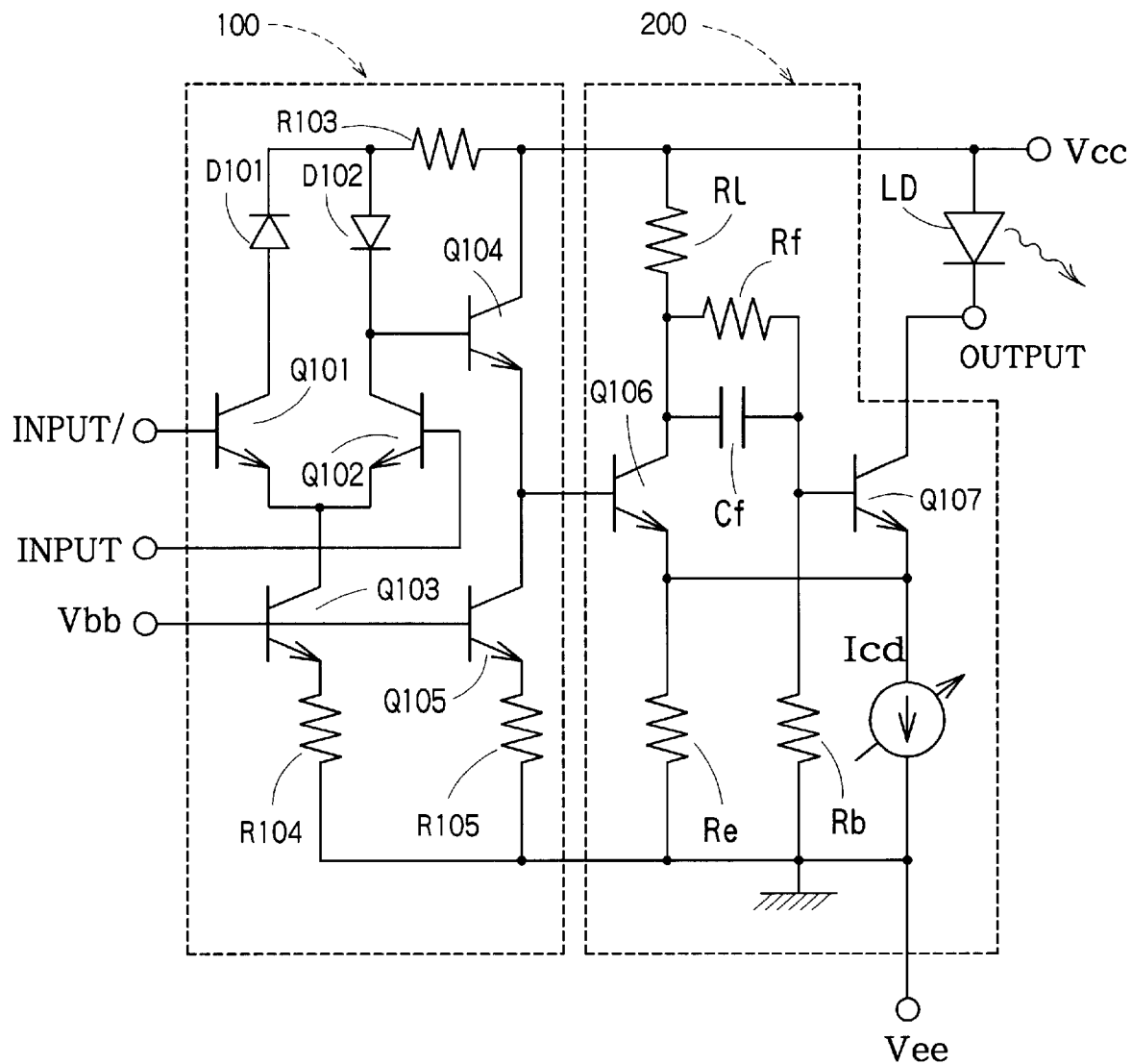
FIG. 10 is a diagram schematically showing a circuit modified in pre-driver load.

FIG. 10 is a circuit diagram schematically showing a modification using diodes D101 and D102 as the load of the transistor Q102. Returning back to FIG. 9, the pulse shaped and amplified in the pre-driver circuit 100 is input to the output circuit 200, and finally output as an ON/OFF-modified current output for driving LD with the pulse current. More specifically, the output pulse signal voltage from the pre-driver circuit is input to the base of the transistor Q106 to which the resistor R1 is connected as the collector load. Connected to the connection node of the collector of Q106 and the load resistor R1 is a resistor Rf, and then a resistor Rb to Rf in series, and Rb are connected to the ground. Further, in order to input a signal to the base of the transistor Q107, the base of the transistor Q107 is connected to the connection node of the resistors Rf and Rb. Additionally, a capacitance Cf is provided in parallel with the resistor Rf to bypass and efficiently transmit the high-frequency signal component to the base of Q107.

Emitters of the transistors Q106 and Q107 are commonly connected and then connected to the ground via a resistor Re. Therefore, the circuit made up of Q106 and Q107 behaves as a kind of pulse amplifier fed back with a current. Additionally, a constant current source is connected to the common emitter connection point of Q106 and Q107.

By adjusting the current value Icd flowing through the constant current source, the circuit can be controlled so that a current of a desired value be output to LD having the collector terminal of the transistor Q107 and connected as an external load. In case of a system configured to activate the circuit so that the collector-emitter voltage of the output transistor enters also into the saturated region, values of the resistors Rf and Rb are determined so that a current bias as large as causing the transistor Q107 to enter into the saturated operation be applied essentially. If no constant current source if connected to the common emitter, the collector-emitter saturated voltage of Q107 is 0.1 V or less, and the current value Id flowing into LD is substantially determined by values of the source voltage Vcc supplied from the exterior, the forward matching voltage and the internal operation resistance of the diode as the electric element property of LD, and the resistor Re.

When the collector load of Q107 is a pure resistance, the output circuit coincides with a Schmitt circuit. Actually, however, since the load is LD, the load impedance largely changes with operating environmental conditions, and under no countermeasure, the injection current output to LD largely changes with power source fluctuation and temperature fluctuation. Therefore, the constant current source connected in parallel with the common emitter is assigned with the role of adjusting the constant current value to be loaded on LD, simultaneously changing the output current value appropriately in response to operation environmental conditions such as source voltage and temperature fluctuation, and always maintaining the current value injected to LD at a desired preset value.

On the other hand, in the case of a system in which the collector-emitter voltage of the output transistor drops closely to the saturated region, but the circuit is activated, basically maintaining the range the non-saturated linear region, values of the resistors Rf and Rb are determined so that a particular base voltage be applied, with which the transistor Q107 regulates the output current to a desired value in the non-saturated operative region. If no constant current source is connected to the common emitter, the current value Id flowing into LD is determined as the current value expressed by (Vh–Vbe)/Re obtained by subtracting the base-emitter voltage Vbe from the high-state voltage Vh of the base of Q107 and dividing its result by the resistance Re. Here again, the output circuit operates similarly to a Schmitt circuit. However, unlike the saturated type, changes in impedance of LD as the load due to the operation environmental conditions do not govern the output current so much, but the base input voltage Vh and the base-emitter voltage Vbe of the transistor Q107 still vary with power source fluctuation and temperature fluctuation, and the injection current Id output to LD changes. therefore, the constant current source connected in parallel with the common emitter is assigned with the role of adjusting the constant current value to be loaded on LD, simultaneously changing the output current value appropriately in response to the operation environmental changes such as power source voltage and temperature fluctuation, and always maintaining the current value injected to LD at a predetermined preset value.

Figure 11:
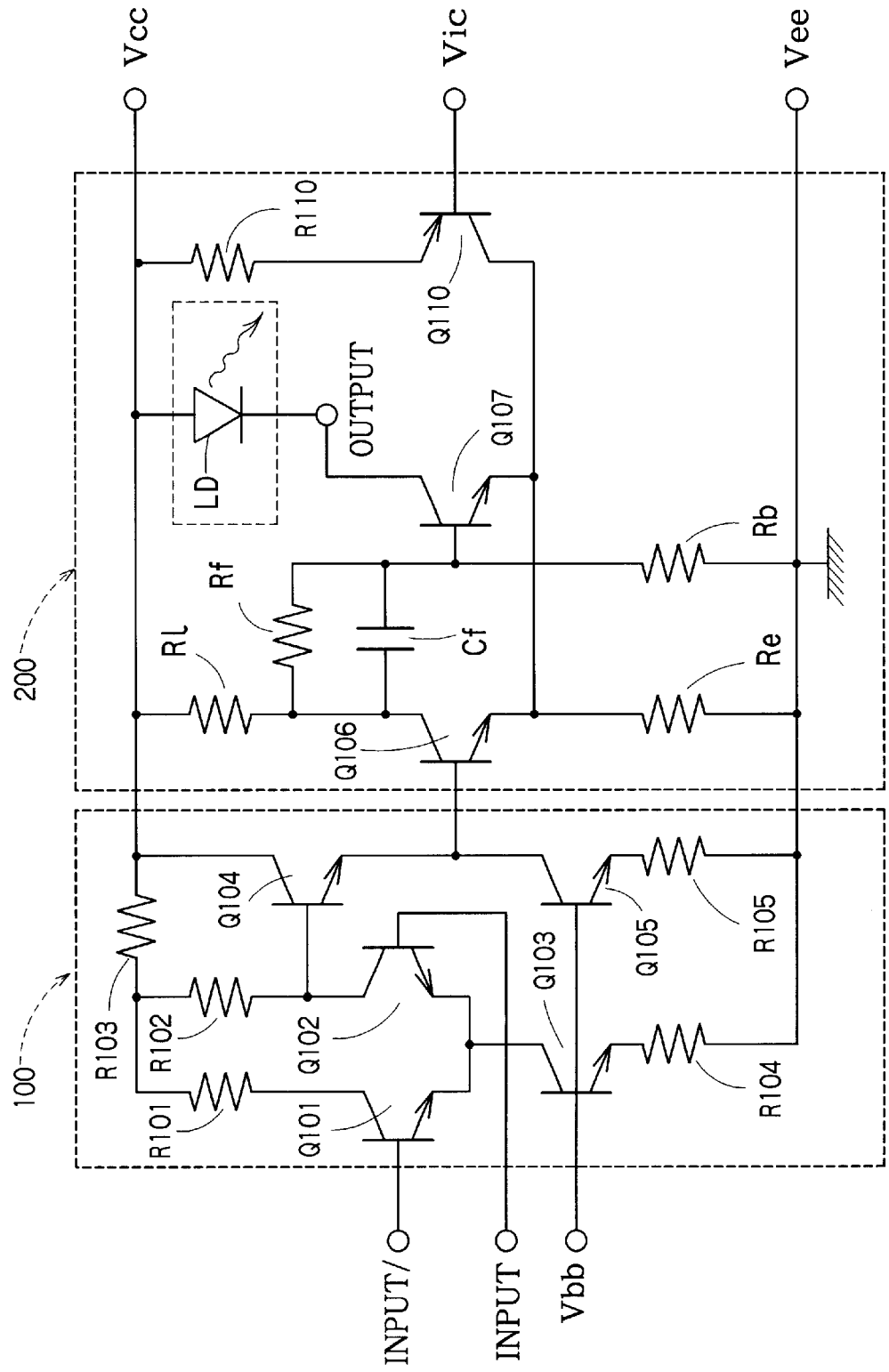
FIG. 11 is a diagram schematically showing a circuit including a standard-type constant current generating circuit.

FIG. 11 is a circuit diagram schematically showing a circuit connecting a concrete constant current source. That is, a constant current source output transistor Q110 is connected to opposite ends of LD, and a controlled voltage Vic is input to the base of the transistor Q110 so that Icd having a property satisfying the aforementioned requirement be generated. In this manner, the output circuit 200 exhibits behaviors substantially equivalent to those of a Schmitt circuit in operation. That is, a certain history is produced in the HIGH-LOW discriminating level for the input voltage, and a rectangular pulse exhibiting a steep transient response property is obtained at the output. Needless to say, concrete numerical values of these characteristic parameters depend upon the actual design and process, and LD. However, it was confirmed by the Inventor through his researches that the value which can be set as the history was 10 mV to 100 mV, a rise and fall time of 200 ps or less could be realized. Since the resistance value of Re connected to the common emitter is normally as small as 100 or less, maximum, whereas the output impedance of the constant current source is basically as large as tens of k or more, the resistance value between the common emitter and the ground connection is not affected by the preset value of the operation current of the current source but always cognized as the same value as Re, and the circuit operates.

On the other hand, to compensate the temperature characteristics of the output current caused by changes in operation impedance of LD remarked as a problem in the saturated output circuit system or changes in Q107 emitter voltage (Vh–Vbe) in case of a non-saturated output circuit system, the temperature-dependent constant current generating circuit proposed by the Inventor in Japanese Patent Application No. H10-42109 may be used.

FIG. 12 is circuit diagram schematically showing a drive circuit according to the invention including the temperature-dependent constant current generating circuit. In the circuit shown here includes a temperature-dependent constant current generating circuit TC connected to opposite ends of LD.

Figure 13:
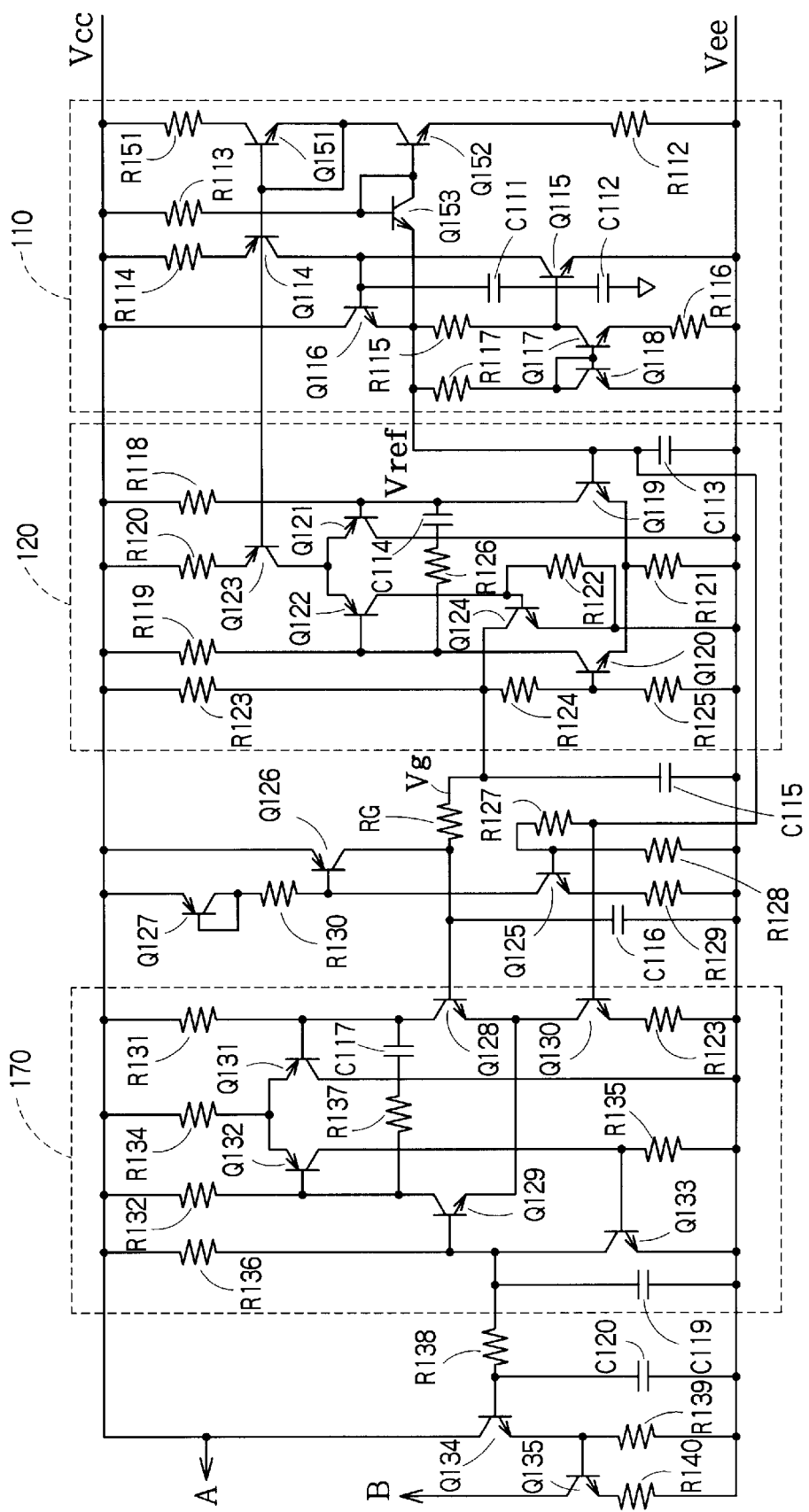
FIG. 13 is a circuit diagram schematically showing an example of the temperature-dependent constant current generating circuit.

FIG. 13 is a circuit diagram schematically showing an example of the temperature-dependent constant current generating circuit TC. That is, in the circuit shown here, a reference voltage generating circuit 110, stabilizing voltage generating circuit 120 and buffer amplifier circuit 170. Their details are disclosed in the specification of Japanese Patent Application No. H10-42109, and not repeated here. However, it is important to determine the value of the resistor R140 connected to the emitter of the constant current output transistor Q135 small enough to ensure that the internal voltage of the mirror current amplifier circuit causes no problems in operation.

The circuit shown in FIG. 14 compensates the temperature characteristics of the LD threshold value very precisely. Therefore, if an IC chip having formed such a temperature-dependent constant voltage generating circuit is mounted together with LD on a carrier with a good thermal conductivity to hold it under the same temperature, temperature compensation can be performed very precisely. That is, even when the property of LD changes due to fluctuation in temperature, the output circuit 200 in the drive circuit according to the invention ensures operations substantially equivalent to those of a Schmitt circuit.

Although the output transistor basically operates in the saturated region or a non-saturated region close to the saturated region in the output circuit 200, all supplied from the collector output terminal to the load LD is the on/off current in any of the operation systems. Therefore, in case of an optical element like LD, which ensures high-frequency modulation only when a DC bias current close to the threshold value is applied, the use of a DC bias supply circuit is indispensable. However, since a pulse current signal is input simultaneously to the terminal of the DC bias current terminal injected to LD, it must be coupled to LD with a low impedance in terms of the direct current or a high impedance in terms of the high-frequency. A normal bias T is used as means for realizing it, but it is an expensive additional part with a large size.

FIG. 14 is a circuit diagram schematically showing construction of a modification directed to avoiding the use of such an additional part. That is, as illustrated there, it is effective to employ the method of providing a constant current source IDC within the circuit and connecting it directly to the collector terminal of the output transistor. A concrete circuit example dealing with this mater will be explained later with reference to FIG. 25.

Figure 15:
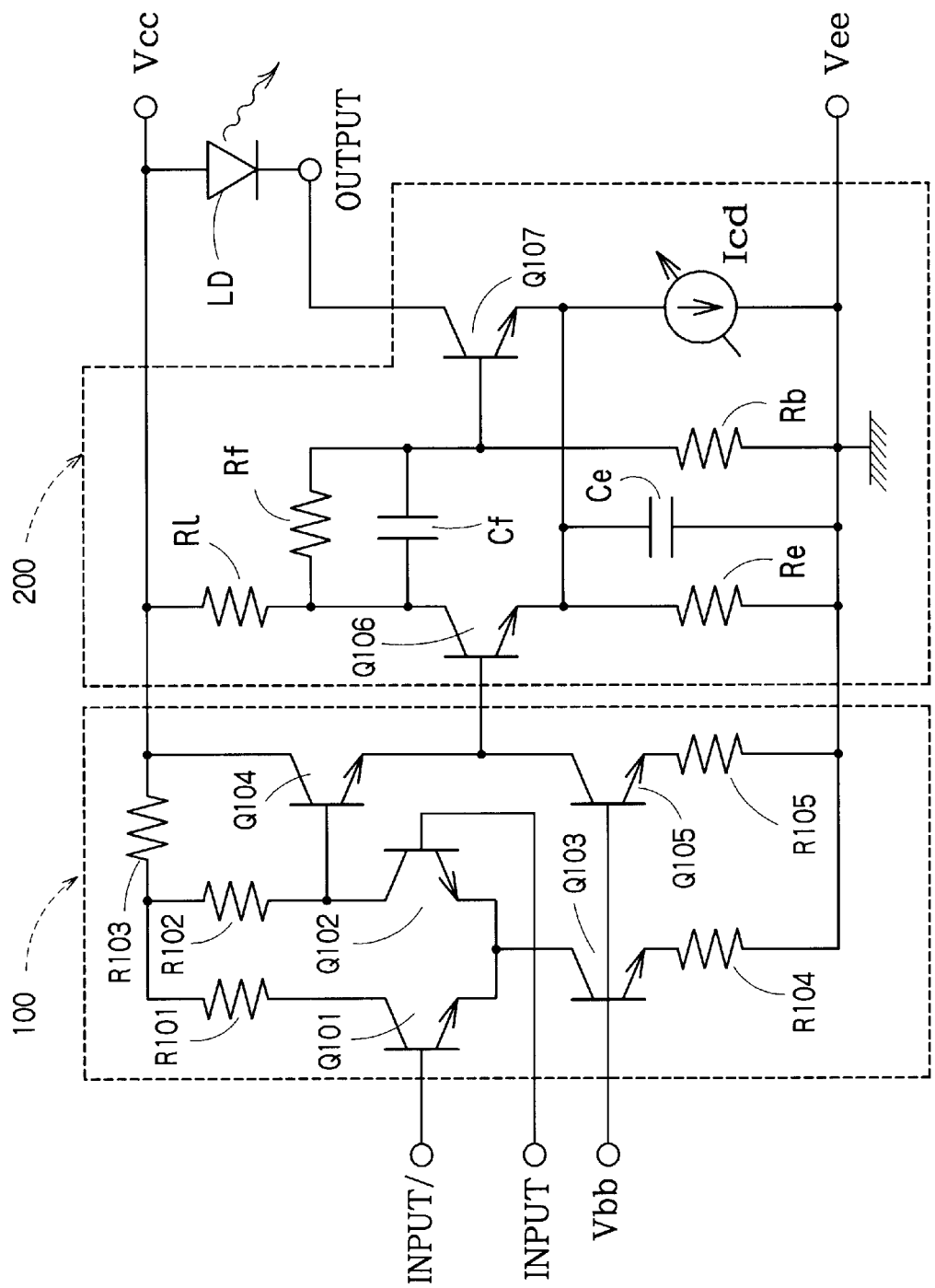
FIG. 15 is a diagram schematically showing a circuit applied with high-frequency peaking for improving its transient response.

FIG. 15 is a circuit diagram schematically showing a modification directed to a further improvement of the frequency characteristics. That is, as illustrates in FIG. 15, by providing a capacitance Ce in parallel with the resistor Re in combination and applying to an output amplifier high-frequency peaking of an appropriate value determined to ensure that the current time constant of RC, i.e., Re×Ce be not larger than 1 ns (nanosecond), it is possible to improve the transient response property of the rectangular pulse output waveform and increase the maximum operation frequency. The optimum value of the capacitance is the value of Ce at the time when it exhibits the property with no overshoot, or not larger than 10%, of the rectangular output pulse. This modified version actually improved the high-frequency operation region characteristics by 15% or more. When the constant current circuit connected in parallel with Re and Ce has an output capacitance, the value obtained by subtracting the constant current circuit output capacitance from the optimum capacitance value determined as explained above may be employed as the value of Ce.

In the circuit diagrams of all subsequent embodiments, Ce explained here is not explicitly shown. However, circuits modified from these circuits by adding Ce are apparently within the scope of the present invention.

In the case where the pre-driver circuit of the emitter follower output is simply connected to the output circuit, the discriminating level changes because of a drop of the base-emitter voltage in response to an increase of the temperature, and basically, it has the property in which the current pulse width loaded to LD changes and the duty ratio of the transmission waveform varies. This temperature dependency appears cleanly especially when the rise and fall time of the output from the pre-driver circuit is large. To suppress this phenomenon, change of the discrimination level at the input portion of the output circuit 200 may be removed.

FIG. 16 is a circuit diagram schematically showing an example actually packaging a circuit for alleviating fluctuation of the discrimination level. To alleviate fluctuation in level causing the switching action of the transistor Q106, the level shift resistor R103 of the pre-driver circuit may be configured to generate a voltage change large enough to compensate the temperature fluctuation of a certain number of equivalent diodes corresponding to half the total number of transistors longitudinally stacked for use in the emitter follower of the pre-driver circuit, that is, 2/2=1 diode in case of FIG. 16. That is, the voltage change to be generated by R103 may be added with a positive temperature coefficient of approximately 1.2 mV/°C. corresponding to a single diode. For this purpose, a temperature-dependent constant current suction source having a positive temperature coefficient may be connected toward the ground connection, and the constant current source may be designed to ensure that the a current change I per unit temperature be the product with the value of the level shift resistor R103, I×R103=1.2 mV/°C.

In the example shown in FIG. 16, the constant current suction source is made up of the transistor Q111, base source Vtc and resistor R111. Although there is a different among respective optimum values involving detail characteristics as well because of a difference among influences to operations of detailed internal circuits, the value determined by the above-explained manner is the first approximated optimum value as the total function of alleviating fluctuation of the output pulse width. In actual circuit design, a strict optimum value is obtained and determined by using transistors used there and their element parameters. Although the band width of a pnp transistors is usually a problem depending on usable processes, it is smaller than that of an npn transistor at least by one digit. In the case where a pnp transistor cannot be used as the constant current source to be connected to the common emitter of the output circuit 200 taking account of the frequency band characteristics, the voltage applied to opposite ends of the resistor Re of FIG. 9 is approximately 0.5 V or less, and the use of the constant current circuit is difficult.

FIG. 17 is a circuit diagram schematically showing a modified version directed to removal of this problem. That is, as illustrated here, it is effective to connect the collector and the emitter of an npn transistor Q112 between the common emitter and the ground connection and introduce a feedback voltage Vtc of the error amplifier A into the base to control the circuit. The transistor Q112 making up the current source must have a size corresponding to an expected maximum amount of generated current, and one with the size as large as n times the basic transistor is used. Simultaneously, another transistor Q113 of the basic size is commonly connected to the collector and the base, and the emitter is connected to the negative reference voltage−Vref via the reference resistor Rref.

By appropriately selecting values of the reference voltage Vref and the reference resistor Rref, a current 1/(n+1) of the current value Icd desirable to set as the current source is ensured to flow. When it is desirable that the determined current Icd has a certain property, the value of Vref is designed to change by the same ratio. In this circuit arrangement, the circuit is controlled by feeding back to the base the voltage Vtc made by amplifying the error voltage in the amplifier A so that the voltage difference of the common node of the emitter of Q113 and the reference resistor Rref from the ground connection be always zero. As a result, the total current flowing into the collectors of Q112 and Q113 is always Icd. By selecting an appropriately large value for n, the maximum collector current can be reduced adequately so that the collector-emitter voltage bringing the voltage-current characteristic of the basis transistor to the saturated characteristic (the voltage near the shoulder where the initial rise changes to a moderate rightward rise in FIG. 28) be larger than the voltage between opposite terminals of the resistor Re. At that time, the operation impedance with which (n+1) basic transistors are operating in parallel can be increased as large as tens times of the value of the resistor Re at worst, and the same property as that by connecting the constant current source can be maintained substantially.

Without using the negative source, the same characteristics can be realized by a circuit system using a current mirror in which the constant current source discharging a current from the Vcc side is used as the reference current.

FIG. 18 is a diagram schematically showing of its basic circuit arrangement. That is, a current Icd/n is input to the transistor Q113 from the constant current source I110 connected to Vcc, and the current is mirror-inverted and output from the collector of Q112. In the illustrated example, since the size of Q113 is 1 when the transistor size of Q112 is n, the current is amplified by the ratio between these sizes, and the current Icd is output. Needless to say, in the case where the current value generated from I110 is too large as the current capacity to be dealt with by the basic transistor with the size 1, if a size suitable for the capacity, i.e., the size of n times, for example, is acceptable, it results in being equivalent also when Q112 and Q113 are multiplied by m, respectively. The output impedance of Q112 is sufficiently smaller than the resistance Re, and the collector voltage of Q112, which is the common emitter voltage of Q105 and Q106, exhibits a substantially constant value. Therefore, even if the operation region of Q112 slightly overlaps the saturated operation region, it is acceptable as the constant current source as long as the current amplification ratio of the transistor does not decrease lower. It was actually confirmed that the circuit was operable without any problems even when the collector-emitter voltage decreases to approximately 0.2 V.

Additionally, oppositely from the circuit shown in FIG. 11 which moves toward decreasing the LD output current when the constant current is increased, the embodiment shown here can increase the output current. Its maximum value is limited by the current capacitance the high-frequency property of the output transistor Q107 can maintain, and the diode forward voltage drop of LD. In order to improve the linearity of the current transmission property by alleviating the dependency of the amplification ratio of the current mirror circuit upon the output current value and the transistor property, the circuit of FIG. 18 may be modified by additionally connecting an amplifier circuit made up of a transistor Q114 and a resistor R107 as shown in FIG. 19.

Figure 19:
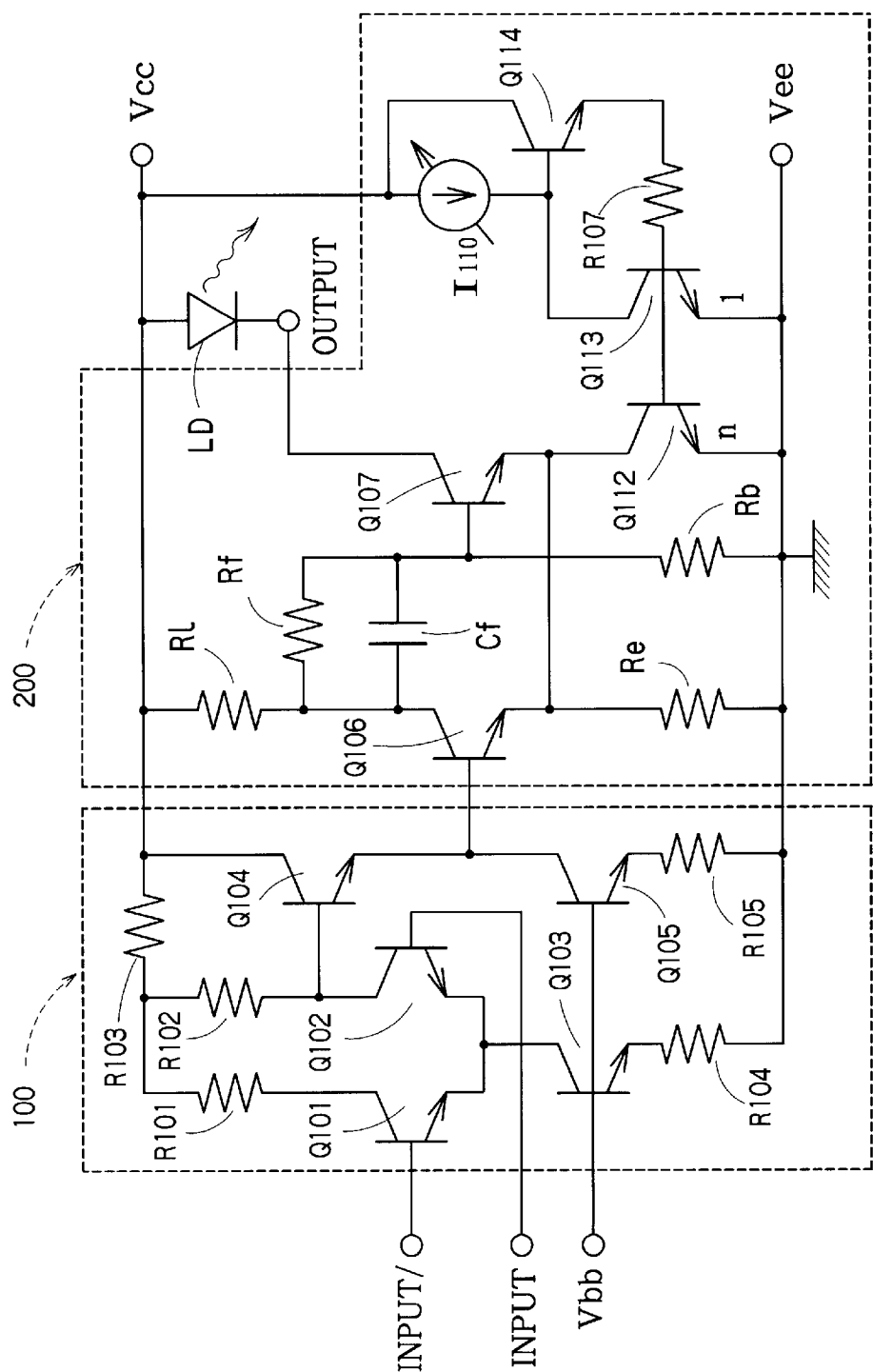
FIG. 19 is a diagram schematically showing a circuit including a constant current generating circuit in a location nearer to a ground connection in form of a current mirror circuit including an amplifier circuit.

FIG. 20 is a circuit diagram schematically showing a more concrete example drawn from the embodiment of FIG. 19. This is a circuit where an additional single-stage current mirror circuit is provided as the constant current source for feeding from the Vcc side instead of directly connecting a current source to Vcc, and the output current Iac from the constant current generating circuit made up of the control voltage Vac, resistor R109 and transistor Q118 is used as the reference current. As a result, since Iac passes through the two-stage mirror circuit, if the transistor size ratio of the mirror circuit is determined as 1 or larger, then a constant current can be injected to the emitter of the output transistor Q107 after amplifying it appropriately. Since it results in permitting the current value of the first generated Iac to be small, the constant current generator can be realized in form of a compact circuit less affected by its own generated heat. Moreover, by combining the dependency of the control voltage Vac on the temperature with the dependency of the base-emitter voltage of Q118 upon the temperature, it is also possible to generate a constant current independent from the temperature as far as Iac is concerned. Additionally, the control property of Vac may be changed as shown in the embodiment of FIG. 11 to implement Iac a negative temperature coefficient and to cancel changes in current flowing in Re.

When the value of R109 connected to the ground potential, a value inversely proportional to it can be obtained as the current Iac. Therefore, the circuit is readily available whichever the adjustment of the pulse current amplitude is provided, inside the chip or outside the chip.

Figure 21:
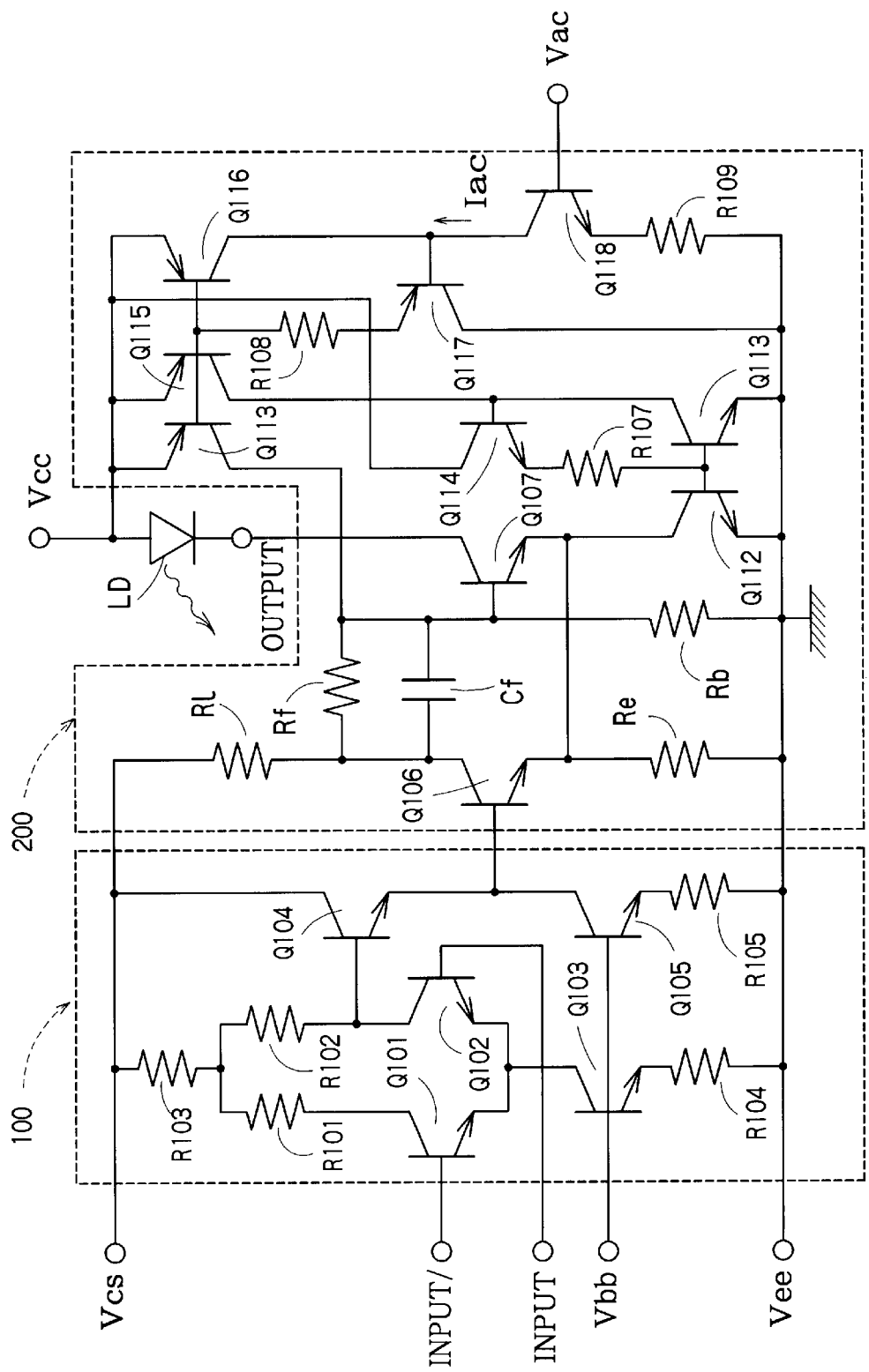
FIG. 21 is a circuit diagram schematically showing an example including a constant current generating circuit located near a ground connection and added with a bias compensating circuit by a constant current source provided in parallel to the initial stage of the two-stage mirror circuits.

FIG. 21 shows a circuit example developed from the embodiment shown in FIG. 20, in which a constant pulse amplitude and a constant transient response waveform are obtained even upon changes in output pulse current amplitude. Essentially, this is a system configured to current-compensate the node of the divisional resistors Rf and Rb, that is, the base of Q107, by the amount of a change in mean bias current injected to the base. The waveform shown in FIG. 22 is that of a current pulse output to the loaded LD from the circuit of FIG. 20 configured not to compensate the current of the base. Here is observed that as the amplitude of the current pulse increases, the pulse width becomes slightly narrower, and the rise property becomes worse. In contrast, FIG. 23 shows the waveform of the current pulse output to the load LD from the circuit of FIG. 21 configured to current-compensate the base. In an actual design where an optimum bias was injected by appropriately selecting the amplification ratio of the current mirror circuit, it was easy to decrease changes in pulse width from the original value, 100 ps, to 20–30 ps or less. Also, it is recognized that the pulse rise waveform has been improved, although slightly.

Figure 24:
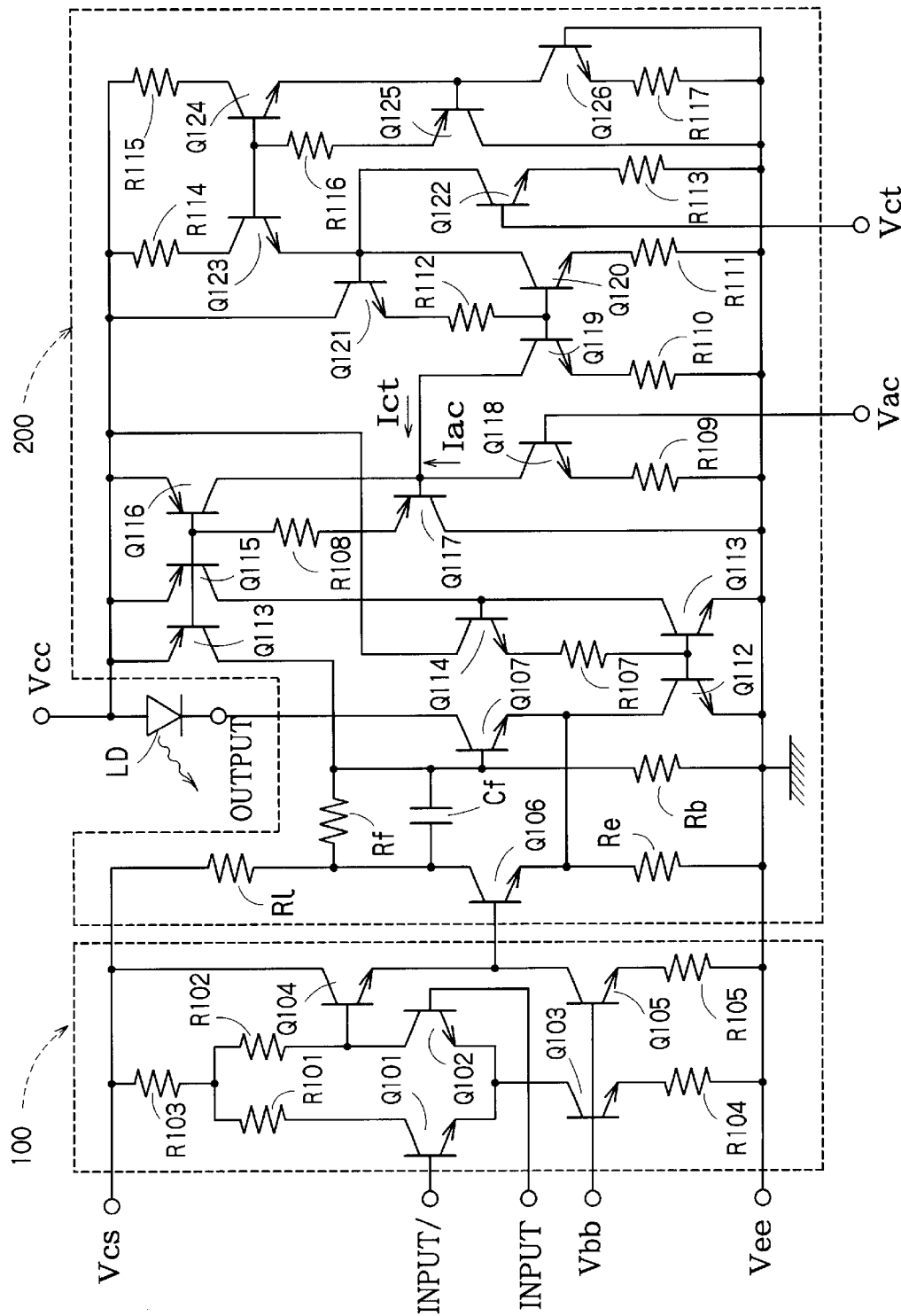
FIG. 24 is a circuit diagram schematically showing an example including a constant current generating circuit for temperature compensation and amplitude adjustment.

FIG. 24 shows a circuit example developed from the circuit example of FIG. 21 to obtain a constant pulse amplitude and a constant transient response waveform over the entire range of operative conditions. A difference current between the output current of a constant current circuit made up of R117 using the control voltage Vac and Q126 and the current generated in a constant current circuit made up of R113 using the control voltage Vct and Q122 is introduced as the collector current of Q120, and it is amplified and inverted in cooperation with the transistor Q119. The output current Ict amplified in Q119 is the reference current which cancels changes in current flowing into Re by implementing the constant current Icd shown in FIG. 9 a negative temperature coefficient. This is synthesized with Iac maintaining a constant current output independently from the operation conditions, and a final current Icd is output from the collector of Q112. This is the circuit arrangement of the example shown in FIG. 24. Therefore, in this embodiment, if the value of R109 alone is finally adjusted, then the pulse amplitude of the output transistor Q107 is definitely determined and output, and the amplitude is maintained constant independently of the operating conditions. In an actually designed example, it was easy to decrease changes in output amplitude caused by changes in operation temperature of IC by 100° C. from the original value, 35%, to 3–4% or less. Furthermore, intending to alleviate changes in transmission property by Q119, Q120, Q123 and Q124 to improve the stability and response of the current mirror circuit relative to changes in Iac and Vcc, additionally connected to respective emitters of the mirror transistors are current feedback resistors R110, R111, R114 and R115 having values inversely proportional to transistor sizes. The use of these feedback resistors is largely effective for decreasing influences from changes in transistor characteristics, fluctuation of the characteristics and fluctuation in source voltage. As a result, a circuit was realized, in which the output amplitude was variable over a wide range while the width of the pulse waveform and transient response properties such as rise and fall times were maintained at constant values.

As explained above, regardless of the saturated type or non-saturated type, the current output from the output circuit 200 to the load LD is an on/off rectangular pulse current, and does not contain any DC bias component. However, in case of an optical element which need continuous application of a DC bias current close to the LD threshold value to ensure a high-frequency modulation property, a circuit system of the principle roughly shown in FIG. 14 may be employed to avoid the use of an additional part such as bias T.

Figure 25:
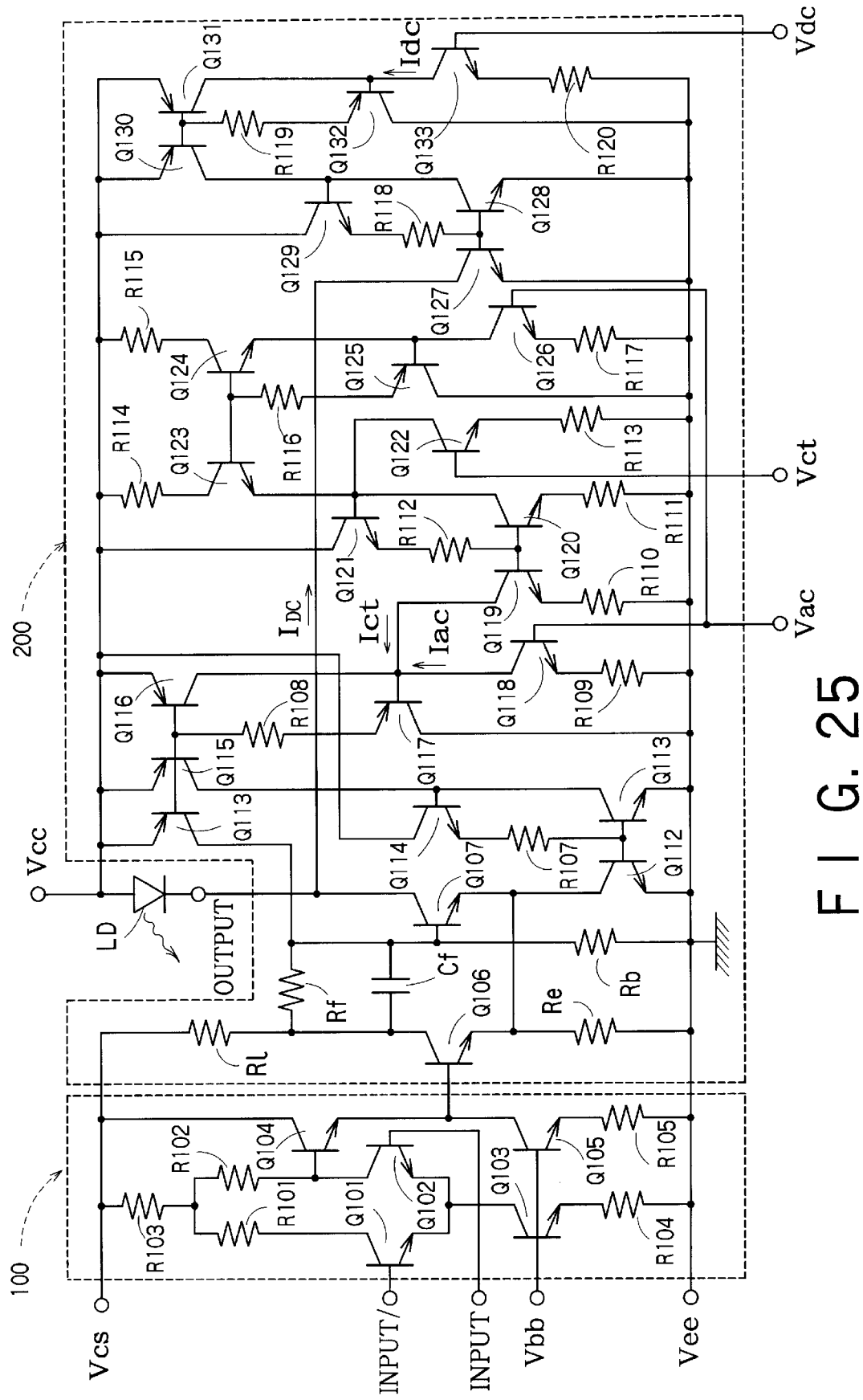
FIG. 25 is a circuit diagram schematically showing an example including a LD DC bias current in addition to the constant current generating circuit for temperature compensation and amplitude adjustment.

FIG. 25 shows a concrete circuit example of FIG. 14, and schematically shows the entirety of a drive circuit further developed from FIG. 22 to involve all functions. Its contents already explained with reference to FIG. 24 are omitted from the following explanation, and a DC current bias circuit shown at the right end position in FIG. 25 and its peripheral circuits are explained below. Basically, a control voltage Vdc shown in a temperature-dependent constant current generating circuit proposed by the Inventor in Japanese Patent Application No. H10-42109 is used as means for compensating the threshold temperature characteristics of LD to generate a current Idc exponentially changed in value relative to changes in temperature by the temperature-dependent constant current generating circuit made up of R120 and Q133. This is amplified in the two-stage mirror-inverted current amplifier, and output from Q127 collector as the DC bias IDC of a desired value. Details of the circuit for generating Vdc optimum for realizing pseudo zero bias driving of LD by tracking temperature changes in LD threshold value are disclosed in the specification of Japanese Patent Application No. H10-42109, and not repeated here. However, it is important to determine the value of the resistor R120 connected to the emitter of the constant current output transistor Q133 small enough to ensure that the internal voltage of the mirror current amplifier circuit causes no problems in operation. The circuit shown in FIG. 25 compensates the temperature characteristics of the LD threshold value very precisely. Therefore, if an IC chip having formed such a temperature-dependent constant voltage generating circuit is mounted together with LD on a carrier with a good thermal conductivity to hold it under the same temperature, then the temperature compensation of the threshold current can be performed very precisely.

Heretofore, the optical semiconductor diode driver circuit according to the invention has been explained with reference to some concrete examples. Next explained is an optical transmission module according to the invention. FIG. 26 is a see-through perspective view schematically showing construction of a central part of the optical transceiver module according to the invention. By using any of the drive circuits already explained with reference to FIGS. 1 through 25, it is possible to realize a transceiver module available for a low voltage power source, which is operable even when the difference between the forward applied voltage of LD and the source voltage of the drive circuit is small. That is, the module shown here includes an IC 1, LD element 2, capacitance 9 and resistor 1, the last two being added to operate normally the module. These parts are packaged on a printed wiring board 4, or a substrate prepared by making a wiring pattern on a Si micro machine-processed chip via an insulator, to form a sub-module. An optical connector 5 is provided on the module in form of a built-in element to optically couple LD on the sub-module to an optical waveguide, such as an optical plastic fiber. Additionally formed at one end of the module is a lead 6 for electrical coupling to the exterior, and these all are collectively molded by a plastic package 7.

FIG. 26 illustrates the lead only on one side of the module, but one or more additional leads may be provided at any appropriate portions, such as the other side edge of the package. Furthermore, one or more leads may be added for the purpose of maintaining the mechanical strength upon mounting the module on a printed board. Moreover, a structure in form of a transceiver module packaging and incorporating a receiver module in parallel with a transmitter module is also within the scope of the invention. FIG. 26 shows a structure containing therein an optical detector 3 and a receiver IC 8 as an example of the optical transceiver module. The invention could realize an optical transceiver module in form of a compact optical connector coupled plastic transceiver module which operates with a single power source, and can commonly use a source voltage supplied to other signal processing ICs, and decreases the consumption power low enough to enable the use of a normal design for heat radiation.

Although the invention is especially effective when applied to an optical semiconductor drive circuit, the load of its output is not limited to an optical semiconductor diode. Using a Si diode as its internal load, a pulse generator for a constant amplitude can be realized. When using a variable current responsive to an input control signal to drive it, a pulse generator having a voltage amplitude proportional to the log property of the input signal can be realized.

Heretofore, the optical element drive circuit according to the invention has been explained by way of examples using Si bipolar transistors. However, the invention is not limited to these examples. For example, although it is needless to say that the circuit has to be modified in accordance with properties of transistor elements employed to form a concrete circuit, optical semiconductor diode drive circuits basically operative in the same manner can be realized without departing from the scope of the invention even when using other transistor elements other than Si bipolar transistors, such as Si MOSFET (metal oxide-semiconductor field effect transistor), CMOS (complimentary MOS), SiGe HBT (hetero-bipolar transistor), GaAs MESFET (metal Schottky FET), HEMT (high electron mobility transistor) using GaAs or InP as its substrate or HBT.

Explanation has been made as using a red LD as the optical semiconductor diode; however, it is not limited to the red LD. Like the case where a red LED is used, also when an optical semiconductor laser of the infrared wavelength band is used by decreasing the source voltage lower and also when a blue LD or LED is used by slightly increasing the source voltage, the invention is applicable without departing from its scope.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No. H10-183084 filed on Jun. 29, 1998 including specification, claims, drawings and summary is incorporated herein by reference in its entirety.

What is claimed is:

1. An optical semiconductor diode driver circuit comprising
   a pre-driver circuit including functions of amplification but limiting the maximum amplitude of the output voltage in said amplification to a predetermined value, operating as a limiter-type amplifier, so as to amplify and shape an input pulse wave form and generate a voltage pulse; and
   an output circuit responsive to said voltage pulse output from said pre-driver circuit to output a drive pulse current to an optical semiconductor diode as an external load, said output circuit including:

a first transistor and a second transistor whose emitters are commonly connected at a common node;

a variable constant current source connected to said common node, said voltage pulse output from said pre-driver circuit being input to a base of said first transistor, a control controller output current output from a collector of said first transistor being input to a base of said second transistor, said second transistor outputting a collector output current as said drive pulse current;

a first resistor connected to the collector of said first transistor;

a first capacitance and a second resistor connected in parallel between the collector of said first transistor and the base of said second transistor;

a third resistor connected to the ground from the base of said second transistor; and a fourth resistor ground-connected to said common node.

2. The optical semiconductor diode driver circuit according to claim 1 wherein said variable constant current source includes:

a current generating circuit changing the amplitude of said drive pulse current; and a current bias current generating circuit having a predetermined negative temperature dependency to compensate so that the amplitude of the current pulse output from said second transistor always maintains a constant value.

3. The optical semiconductor diode driver circuit according to claim 1 wherein said output circuit further includes a constant current generating circuit connected to the collector of said second transistor to add a DC bias current of a constant value to said drive pulse current.

4. The optical semiconductor diode driver circuit according to claim 1 wherein said output circuit further includes a second capacitance connected to the ground in parallel with said fourth resistor, said second capacitance having a capacitance value to ensure a RC time constant below one nanosecond with respect to said fourth resistor.

5. An optical semiconductor diode driver circuit comprising:

a pre-driver circuit including functions of amplification but limiting the maximum amplitude of the output voltage in said amplification to a predetermined value, operating as a limiter-type amplifier, so as to amplify and shape an input pulse wave form and generate a voltage pulse; and an output circuit responsive to said voltage pulse output from said pre-driver circuit to output a drive pulse current to an optical semiconductor diode as an external load, said output circuit including:

a first transistor and a second transistor whose emitters are commonly connected at a common node; and a variable constant current source connected to said common node, said voltage pulse output from said pre-driver circuit being input to the base of said first transistor, a collector controller output current output from a collector of said first transistor being input to a base of said second transistor, said second transistor outputting a collector output current as said drive pulse current;

wherein said variable constant current source of said output circuit includes:

an emitter-grounded transistor of a size n which is connected in parallel between said common node and the ground connection;

a unit transistor of a size 1 including a collector connected to said common node and a base connected to the base of said transistor of the size n, in which a constant current in the amount of 1/(n+1) of a current value biased to said common node; and an error amplifying/feedback circuit network for supplying a feedback signal to the base of said transistor of the size n and the base of said transistor of the size 1 to always maintain zero as the voltage difference between the emitter of said unit transistor and the ground connection.

6. An optical semiconductor diode driver circuit comprising;

a pre-driver circuit including functions of amplification but limiting the maximum amplitude of the output voltage in said amplification to a predetermined value, operating as a limiter-type amplifier, so as to amplify and shape an input pulse wave form and generate a voltage pulse; and an output circuit responsive to said voltage pulse output from said pre-driver circuit to output a drive pulse current to an optical semiconductor diode as an external load, said output circuit including:

a first transistor and a second transistor whose emitters are commonly connected at a common node; and a variable constant current source connected to said common node, said voltage pulse output from said pre-driver circuit being input to a base of said first transistor, a control controller output current output from a collector of said first transistor being input to a base of said second transistor, said second transistor outputting a collector output current as said drive pulse current;

wherein said variable constant current source of said output circuit includes:

a first current mirror circuit and a first reference current generating source, said first current mirror circuit including in combination an emitter-grounded transistor having a size n×m and having a collector connected between said common node and the ground connection, and a transistor having a size m and paired with said transistor having the size n×m, said first reference current generating source introducing into said first current mirror circuit a constant current in the amount of 1/n of the current value biased to the common node.

7. An optical semiconductor diode driver circuit comprising:

a pre-driver circuit including functions of amplification but limiting the maximum amplitude of the output voltage in said amplification to a predetermined value, operating as a limiter-type amplifier, so as to amplify and shape an input pulse wave form and generate a voltage pulse; and an output circuit responsive to said voltage pulse output from said pre-driver circuit to output a drive pulse current to an optical semiconductor diode as an external load, said output circuit including:

a first transistor and a second transistor whose emitters are commonly connected at a common node; and a variable constant current source connected to said common node, said voltage pulse output from said pre-driver circuit being input to a base of said first transistor, a control controller output current output from a collector of said first transistor being input to a base of said second transistor, said second transistor outputting a collector output current as said drive pulse current;

wherein a reference current generating source includes:
    a second current mirror circuit connected to a power source line;
    a second reference current generating circuit supplying a current to be injected into said second current mirror circuit; and
    another constant current output transistor connected in parallel with said second current mirror circuit output transistor to introduce to the base of said second transistor a compensation bias current for the purpose of always maintaining a constant pulse width against changes in amplitude of the output pulse current.

\* \* \* \* \*